(12) United States Patent
Zhang

(10) Patent No.: US 12,300,317 B2
(45) Date of Patent: *May 13, 2025

(54) THREE-DIMENSIONAL MEMORY DEVICE AND METHODS FOR FORMING THE SAME

(71) Applicant: YANGTZE MEMORY TECHNOLOGIES CO., LTD., Wuhan (CN)

(72) Inventor: Mingkang Zhang, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 434 days.

This patent is subject to a terminal disclaimer.

(21) Appl. No.: 17/488,748

(22) Filed: Sep. 29, 2021

(65) Prior Publication Data

US 2023/0065384 A1    Mar. 2, 2023

Related U.S. Application Data

(63) Continuation of application No. PCT/CN2021/115738, filed on Aug. 31, 2021.

(51) Int. Cl.
*H01L 23/00* (2006.01)
*G11C 16/04* (2006.01)
(Continued)

(52) U.S. Cl.
CPC .......... *G11C 16/0483* (2013.01); *H01L 24/08* (2013.01); *H01L 24/80* (2013.01);
(Continued)

(58) Field of Classification Search
CPC ..... G11C 16/0483; H01L 24/08; H01L 24/80; H01L 25/0657; H01L 2224/08148;
(Continued)

(56) References Cited

U.S. PATENT DOCUMENTS 9,530,790 B1 * 12/2016 Lu .................. H01L 29/7883
9,620,512 B1 *  4/2017 Nishikawa ........ H01L 29/42392
(Continued)

FOREIGN PATENT DOCUMENTS

CN         107895724 A      4/2018
CN         108431961 A  *   8/2018   ........ H01L 27/11524
(Continued)

OTHER PUBLICATIONS

International Search Report issued in corresponding International Application No. PCT/CN2021/115757, mailed May 26, 2022, 4 pages.
(Continued)

*Primary Examiner* — Mohammed Shamsuzzaman
(74) *Attorney, Agent, or Firm* — BAYES PLLC

(57) ABSTRACT

In certain aspects, a three-dimensional (3D) memory device includes a first semiconductor structure and a second semiconductor bonded with the first semiconductor structure. The first semiconductor structure includes an array of NAND memory strings, a semiconductor layer in contact with source ends of the array of NAND memory strings, an insulating layer in contact with the semiconductor layer, and a contact structure in the insulating layer. The insulating layer electrically insulates the contact structure from the semiconductor layer. The second semiconductor structure includes a transistor.

18 Claims, 21 Drawing Sheets

(51) Int. Cl.

| | |
|---|---|
| *H01L 25/065* | (2023.01) |
| *H10B 41/27* | (2023.01) |
| *H10B 41/35* | (2023.01) |
| *H10B 41/41* | (2023.01) |
| *H10B 43/27* | (2023.01) |
| *H10B 43/35* | (2023.01) |
| *H10B 43/40* | (2023.01) |

(52) U.S. Cl.
CPC ......... *H01L 25/0657* (2013.01); *H10B 41/27* (2023.02); *H10B 41/35* (2023.02); *H10B 41/41* (2023.02); *H10B 43/27* (2023.02); *H10B 43/35* (2023.02); *H10B 43/40* (2023.02); *H01L 2224/08148* (2013.01); *H01L 2224/80895* (2013.01); *H01L 2224/80896* (2013.01); *H01L 2225/06524* (2013.01); *H01L 2225/06544* (2013.01); *H01L 2924/1431* (2013.01); *H01L 2924/1438* (2013.01)

(58) Field of Classification Search
CPC . H01L 2224/80895; H01L 2224/80896; H01L 2225/06524; H01L 2225/06544; H01L 2924/1431; H01L 2924/1438; H01L 25/18; H01L 25/50; H01L 2224/08145; H01L 21/02532; H01L 21/02576; H01L 21/02592; H01L 21/02675; H01L 21/30604; H10B 41/27; H10B 41/35; H10B 41/41; H10B 43/27; H10B 43/35; H10B 43/40; H10B 80/00; H10B 41/40
See application file for complete search history.

(56) References Cited

U.S. PATENT DOCUMENTS

| | | | |
|---|---|---|---|
| 10,199,326 B1 | 2/2019 | Ohsaki | |
| 10,256,248 B2 * | 4/2019 | Lu | H01L 23/498 |
| 10,381,362 B1 | 8/2019 | Cui et al. | |
| 10,629,616 B1 * | 4/2020 | Kai | H10B 43/10 |
| 10,720,445 B1 * | 7/2020 | Shimizu | H01L 23/5226 |
| 2016/0307910 A1 | 10/2016 | Son et al. | |
| 2016/0322381 A1 * | 11/2016 | Liu | H10B 41/27 |
| 2017/0179154 A1 * | 6/2017 | Furihata | H10B 41/41 |
| 2017/0373078 A1 * | 12/2017 | Chu | H10B 43/35 |
| 2019/0081068 A1 | 3/2019 | Huang et al. | |
| 2019/0088589 A1 | 3/2019 | Zhu et al. | |
| 2020/0279841 A1 | 9/2020 | Sanuki | |
| 2020/0312765 A1 | 10/2020 | Kawasaki et al. | |
| 2020/0350287 A1 * | 11/2020 | Liu | H10B 43/35 |
| 2020/0388630 A1 | 12/2020 | Yun et al. | |
| 2020/0395376 A1 * | 12/2020 | Huo | H10B 43/27 |
| 2021/0074716 A1 | 3/2021 | Lim et al. | |
| 2021/0082865 A1 * | 3/2021 | Baraskar | H01L 25/0657 |
| 2021/0118989 A1 | 4/2021 | Liu et al. | |
| 2022/0059560 A1 * | 2/2022 | Parekh | H10B 41/35 |
| 2022/0336484 A1 * | 10/2022 | Iwai | H10B 41/40 |
| 2023/0061992 A1 * | 3/2023 | Zhang | H01L 21/76886 |
| 2023/0106571 A1 * | 4/2023 | Shen | G11C 8/14 |
| | | | 257/314 |
| 2024/0057340 A1 * | 2/2024 | Parekh | H10B 43/27 |

FOREIGN PATENT DOCUMENTS

| | | | | |
|---|---|---|---|---|
| CN | 109863597 A * | 6/2019 | ....... | H01L 21/28008 |
| CN | 110249427 A | 9/2019 | | |
| CN | 110291586 A | 9/2019 | | |
| CN | 110720143 A | 1/2020 | | |
| CN | 111373537 A * | 7/2020 | ....... | H01L 21/76805 |
| CN | 111566815 A | 8/2020 | | |
| CN | 111684583 A * | 9/2020 | ............ | G11C 5/063 |
| CN | 112204734 A | 1/2021 | | |
| CN | 113169182 A * | 7/2021 | ............. | H01L 24/92 |
| CN | 113228271 A * | 8/2021 | ......... | H01L 21/7624 |
| CN | 113257739 A | 8/2021 | | |
| JP | S57157559 A | 9/1982 | | |
| JP | 2005175463 A | 6/2005 | | |
| JP | 2020513164 A | 4/2020 | | |
| JP | 202148249 A | 3/2021 | | |
| JP | 2021040125 A | 3/2021 | | |
| JP | 2021064731 A | 4/2021 | | |
| KR | 20200036503 A | 4/2020 | | |
| WO | WO-2018194750 A1 * | 10/2018 | ........ | H01L 27/11573 |
| WO | 2019052127 A1 | 3/2019 | | |
| WO | 2020167355 A | 8/2020 | | |
| WO | 2021022403 A | 2/2021 | | |

OTHER PUBLICATIONS

International Search Report issued in corresponding International Application No. PCT/CN2021/115738, mailed May 26, 2022, 4 pages.

Supplementary European Search Report issued in corresponding European Application No. 21 95 5416, mailed on Jun. 24, 2024, 10 pages.

Notice of Reasons for Refusal issued in corresponding Japanese Application No. 2023-557427, dated Aug. 20, 2024, 12 pages.

* cited by examiner

600

THREE-DIMENSIONAL MEMORY DEVICE AND METHODS FOR FORMING THE SAME

CROSS-REFERENCE TO RELATED APPLICATIONS

This application is continuation of International Application No. PCT/CN2021/115738, filed on Aug. 31, 2021, entitled "THREE-DIMENSIONAL MEMORY DEVICE AND METHODS FOR FORMING THE SAME," which is hereby incorporated by reference in its entirety. This application is also related to U.S. application Ser. No. 17/488,766, filed on Sep. 29, 2021, entitled "THREE-DIMENSIONAL MEMORY DEVICE AND METHODS FOR FORMING THE SAME," which is hereby incorporated by reference in its entirety.

BACKGROUND

The present disclosure relates to memory devices and fabrication methods thereof Planar memory cells are scaled to smaller sizes by improving process technology, circuit design, programming algorithm, and fabrication process. However, as feature sizes of the memory cells approach a lower limit, planar process and fabrication techniques become challenging and costly. As a result, memory density for planar memory cells approaches an upper limit.

A three-dimensional (3D) memory architecture can address the density limitation in planar memory cells. The 3D memory architecture includes a memory array and peripheral circuits for facilitating operations of the memory array.

SUMMARY

In one aspect of the present disclosure, a 3D memory device includes a first semiconductor structure and a second semiconductor bonded with the first semiconductor structure. The first semiconductor structure includes an array of NAND memory strings, a semiconductor layer in contact with source ends of the array of NAND memory strings, an insulating layer in contact with the semiconductor layer, and a contact structure in the insulating layer. The insulating layer electrically insulates the contact structure from the semiconductor layer. The second semiconductor structure includes a transistor.

In another aspect of the prsent disclosure, a 3D memory device that includes a first semiconductor structure having a core region and a non-array region. The first semiconductor structure includes an array of NAND memory strings in a sub-region of the core region, a semiconductor layer in contact with source ends of the array of NAND memory strings, an insulating layer in the non-array region, and a plurality of contact structures in the insulating layer and in anothersub-region of the non-array region. The insulating layer electrically insulates the contact structures from the semiconductor layer. The 3D memory device also includes a second semiconductor structure bonded with the first semiconductor layer. The second semiconductor structure includes a transistor.

In another aspect of the prsent disclosure, a method for forming a 3D memory device. The method includes bonding a first semiconductor structure and a second semiconductor structure together, the first semiconductor structure having a core region and a non-array region. The method also includes depositing a doped amorphous silicon layer over the core region and the non-array region of the first semiconductor structure, removing a first portion of the doped amorphous silicon layer in the non-array region to form an opening that exposes a first contact portion, converting a second portion of the doped amorphous silicon layer in the core region to a doped polysilicon layer, forming an insulating layer in the opening, and forming a second contact portion in the insulating layer. The second contact portion is in contact with the first contact portion.

Another aspect of the present disclosure provides a system. The system includes a memory device configured to store data. The memory device includes a first semiconductor structure that has an array of NAND memory strings, a semiconductor layer in contact with source ends of the array of NAND memory strings, an insulating layer in contact with the semiconductor layer, a contact structure in the insulating layer, wherein the insulating layer electrically insulates the contact structure from the semiconductor layer, and a second semiconductor structure bonded with the first semiconductor structure. The second semiconductor structure includes a peripheral circuit. The system also includes a memory controller coupled to the memory device and configured to control the array of NAND memory strings through the peripheral circuit.

BRIEF DESCRIPTION OF THE DRAWINGS

The accompanying drawings, which are incorporated herein and form a part of the specification, illustrate aspects of the present disclosure and, together with the description, further serve to explain the principles of the present disclosure and to enable a person skilled in the pertinent art to make and use the present disclosure.

Figure 1A:
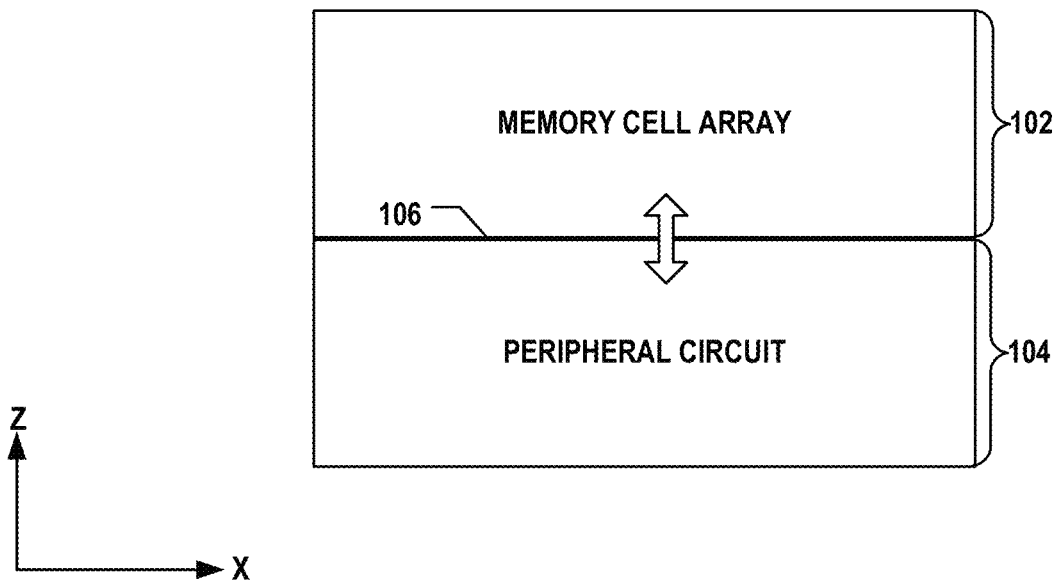
FIG. 1A illustrates a schematic view of a cross-section of a 3D memory device, according to some aspects of the present disclosure.

The present disclosure will be described with reference to the accompanying drawings.

DETAILED DESCRIPTION

Although specific configurations and arrangements are discussed, it should be understood that this is done for illustrative purposes only. As such, other configurations and arrangements can be used without departing from the scope of the present disclosure. Also, the present disclosure can also be employed in a variety of other applications. Functional and structural features as described in the present disclosures can be combined, adjusted, and modified with one another and in ways not specifically depicted in the drawings, such that these combinations, adjustments, and modifications are within the scope of the present disclosure.

In general, terminology may be understood at least in part from usage in context. For example, the term "one or more" as used herein, depending at least in part upon context, may be used to describe any feature, structure, or characteristic in a singular sense or may be used to describe combinations of features, structures, or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations), and the spatially relative descriptors used herein may likewise be interpreted accordingly.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layers thereupon, thereabove, and/or therebelow. A layer can include multiple layers. For example, an interconnect layer can include one or more conductors and contact layers (in which interconnect lines and/or vertical interconnect access (via) contacts are formed) and one or more dielectric layers.

In a 3D memory devices, peripheral circuits and memory cell arrays of a memory device are disposed in different planes (levels, tiers) in the vertical direction, i.e., stacked over one another, to reduce the planar chip size of the peripheral circuits, as well as the total chip size of the memory device. In the 3D memory devices, the memory cells are formed by the intersections of NAND memory strings and word lines. The NAND memory strings are formed extending vertically in the memory stack (e.g., conductive/dielectric layer pairs), and source ends of the NAND memory strings are in contact with a semiconductor layer that functions as part of a source contact for applying a source voltage on the NAND memory strings. The memory stacks and the peripheral circuits are often integrated together through bonding in the 3D NAND Flash memory devices.

To form electrical connections in a 3D memory device (e.g., between the memory cell arrays and the peripheral circuits) and/or beyond the 3D memory device (e.g., between the 3D NAND Flash memory device and external circuitry), through-silicon contacts (TSCs) are often formed. To insulate the TSCs from the semiconductor layer, the portion of the semiconductor layer in contact with the NAND memory strings is often disconnected from the portion of the semiconductor layer through which the TSCs extend. An insulating portion is formed between the two portions of the semiconductor layer for insulation. Meanwhile, a respective insulating spacer is formed in the semiconductor layer such that the TSCs is each insulated from the semiconductor layer by the respective insulating spacer. The insulating spacers and the insulating portion are often formed by patterning the semiconductor layer to form openings and filling the openings with a dielectric material. Due to the small critical dimensions of these openings, the deposition of the dielectric material often includes atomic layer deposition (ALD). This fabrication process can be costly due to the high expense of photolithography, etching, and deposition. Meanwhile, the small critical dimensions of the openings can cause the etching process to form the openings to be undesirably complex, and the precise alignment between the openings and the TSCs to be challenging.

To address one or more of the aforementioned issues, the present disclosure provides structures and fabrication methods of a 3D memory device, in which the critical dimension of the opening to form the insulating layer that insulates the TSCs and the semiconductor layer is increased and the etching process to form the opening is less challenging. The cost and the difficulty in insulating different portions of a semiconductor layer can be reduced. The 3D memory device, having a core region and a non-array region, includes a plurality of NAND memory strings in the core region and one or more TSCs in the non-array region. A semiconductor layer is in contact with the source ends of the NAND strings in the core region. According to the present disclosure, instead of forming a respective insulating spacer to insulate each TSC from the semiconductor layer, a single insulating layer can be formed to insulate a plurality of TSCs from the semiconductor layer. A lateral width of the insulating layer is sufficiently large to insulate any (e.g., all) TSCs from the semiconductor layer. The insulating layer can be formed at any suitable location where insulation is needed and is away from the source ends of the NAND memory strings. For example, the insulating layer can be formed in the non-array region. The insulating layer is in contact with the semiconductor layer laterally, and has the same thickness as the semiconductor layer. In some implementations, the insulating layer includes a dielectric material such as one or more of silicon oxide, silicon nitride, and silicon oxynitride.

Different from an existing patterning technique which includes a photolithography process and an etching process, the formation of the opening, in which the insulating layer is formed, of the present disclosure includes a local thermal treatment, e.g., a laser anneal process, and a selective etching process. A doped amorphous silicon layer is first deposited to be in contact with the source ends of the NAND memory strings, and a portion of the doped amorphous silicon layer undergoes a local thermal treatment to be converted to a doped polysilicon portion. The area of the treated portion of the doped amorphous silicon layer can cover any TSCs to be insulated and have no overlap with the source ends of the NAND memory strings. In some implementations, a laser anneal process is performed for the conversion. The doped polysilicon portion is selectively etched away, forming an opening in the untreated doped amorphous silicon layer. The doped amorphous silicon portion is further converted to a doped polysilicon layer, and an insulating material is deposited into the opening. The insulating layer can further be patterned such that the TSCs can extend through the insulating layer.

In the fabrication process of the present disclosure, no photolithography is needed for the formation of the opening in which the insulating layer is formed. Instead, the patterning of the doped amorphous silicon layer includes a laser anneal process and a selective etching process. The critical dimension of the doped polysilicon portion/insulating layer is desirably large such that the laser beam can be precisely controlled for the annealing of the desired area of the doped amorphous silicon layer. Compared to the existing patterning technique, the difficulty and cost of patterning can be reduced. The larger critical dimension of the insulating layer also allows other deposition methods, such as chemical vapor deposition (CVD) and/or physical vapor deposition (PVD), to be used for forming the insulating layer, further reducing the fabrication cost. The increased area of the insulating layer can also reduce the parasitic capacity of the 3D memory device.

Figure 1B:
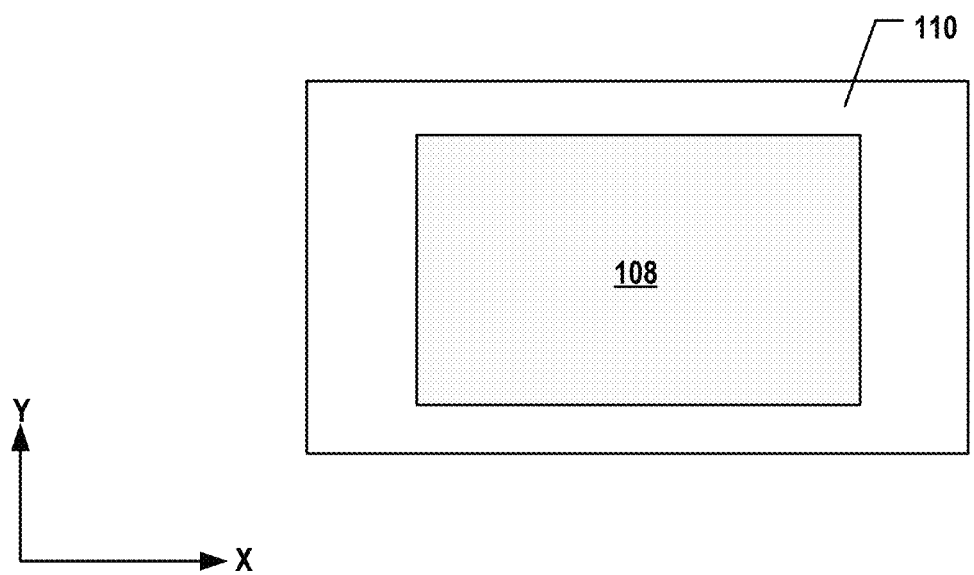
FIG. 1B illustrates an overview of the 3D memory device, according to some aspects of the present disclosure.

FIG. 1A illustrates a schematic view of a cross-section of a 3D memory device 100, according to some aspects of the present disclosure. FIG. 1B illustrates an overview of 3D memory device 100, according to some aspects of the present disclosure. 3D memory device 100 represents an example of a bonded chip. In some implementations, at least some of the components of 3D memory device 100 (e.g., memory cell array and peripheral circuits) are formed separately on different substrates in parallel and then jointed to form a bonded chip (a process referred to herein as a "parallel process").

It is noted that x-, y-, and z- axes are added in the figures of the present disclosure to further illustrate the spatial relationships of the components of a semiconductor device. A substrate of a semiconductor device, e.g., 3D memory device 100, includes two lateral surfaces (e.g., a top surface and a bottom surface) extending laterally in the x-direction and y-direction (the lateral directions or width directions). The x-direction is the word line direction of 3D memory device 100, the y-direction is the bit line direction of 3D memory device 100, and the z-direction is the perpendicular to the x-y plane. In some implementations, the z-direction is the NAND direction in which the NAND memory strings extend vertically. As used herein, whether one component (e.g., a layer or a device) is "on," "above," or "below" another component (e.g., a layer or a device) of a semiconductor device is determined relative to the substrate of the semiconductor device in the z-direction (the vertical direction or thickness direction) when the substrate is positioned in the lowest plane of the semiconductor device in the z-direction. The same notion for describing the spatial relationships is applied throughout the present disclosure.

3D memory device 100 can include a first semiconductor structure 102 including an array of memory cells (also referred to herein as a "memory cell array"). In some implementations, the memory cell array includes an array of NAND Flash memory cells. For ease of description, a NAND Flash memory cell array may be used as an example for describing the memory cell array in the present disclosure. But it is understood that the memory cell array is not limited to NAND Flash memory cell array and may include any other suitable types of memory cell arrays, such as NOR Flash memory cell array, phase change memory (PCM) cell array, resistive memory cell array, magnetic memory cell array, spin transfer torque (STT) memory cell array, to name a few.

First semiconductor structure 102 can be a NAND Flash memory device in which memory cells are provided in the form of an array of 3D NAND memory strings and/or an array of two-dimensional (2D) NAND memory cells. NAND memory cells can be organized into pages or fingers, which are then organized into blocks in which each NAND memory cell is coupled to a separate line called a bit line (BL). All cells with the same vertical position in the NAND memory cell can be coupled through the control gates by a word line (WL). In some implementations, a memory plane contains a certain number of blocks that are coupled through the same bit line. First semiconductor structure 102 can include one or more memory planes, and the peripheral circuits that are needed to perform all the read/program (write)/erase operations can be included in a second semiconductor structure 104.

In some implementations, the array of NAND memory cells is an array of 2D NAND memory cells, each of which includes a floating-gate transistor. The array of 2D NAND memory cells includes a plurality of 2D NAND memory strings, each of which includes a plurality of memory cells connected in series (resembling a NAND gate) and two select transistors, according to some implementations. Each 2D NAND memory string is arranged in the same plane (i.e., referring to herein a flat, two-dimensional (2D) surface, different from the term "memory plane" in the present discourse) on the substrate, according to some implementations. In some implementations, the array of NAND memory cells is an array of 3D NAND memory strings, each of which extends vertically above a semiconductor layer (in 3D) through a stack structure, e.g., a memory stack. Depending on the 3D NAND technology (e.g., the number of layers/tiers in the memory stack), a 3D NAND memory string typically includes a certain number of NAND memory cells, each of which includes a floating-gate transistor or a charge-trap transistor.

Figure 3A:
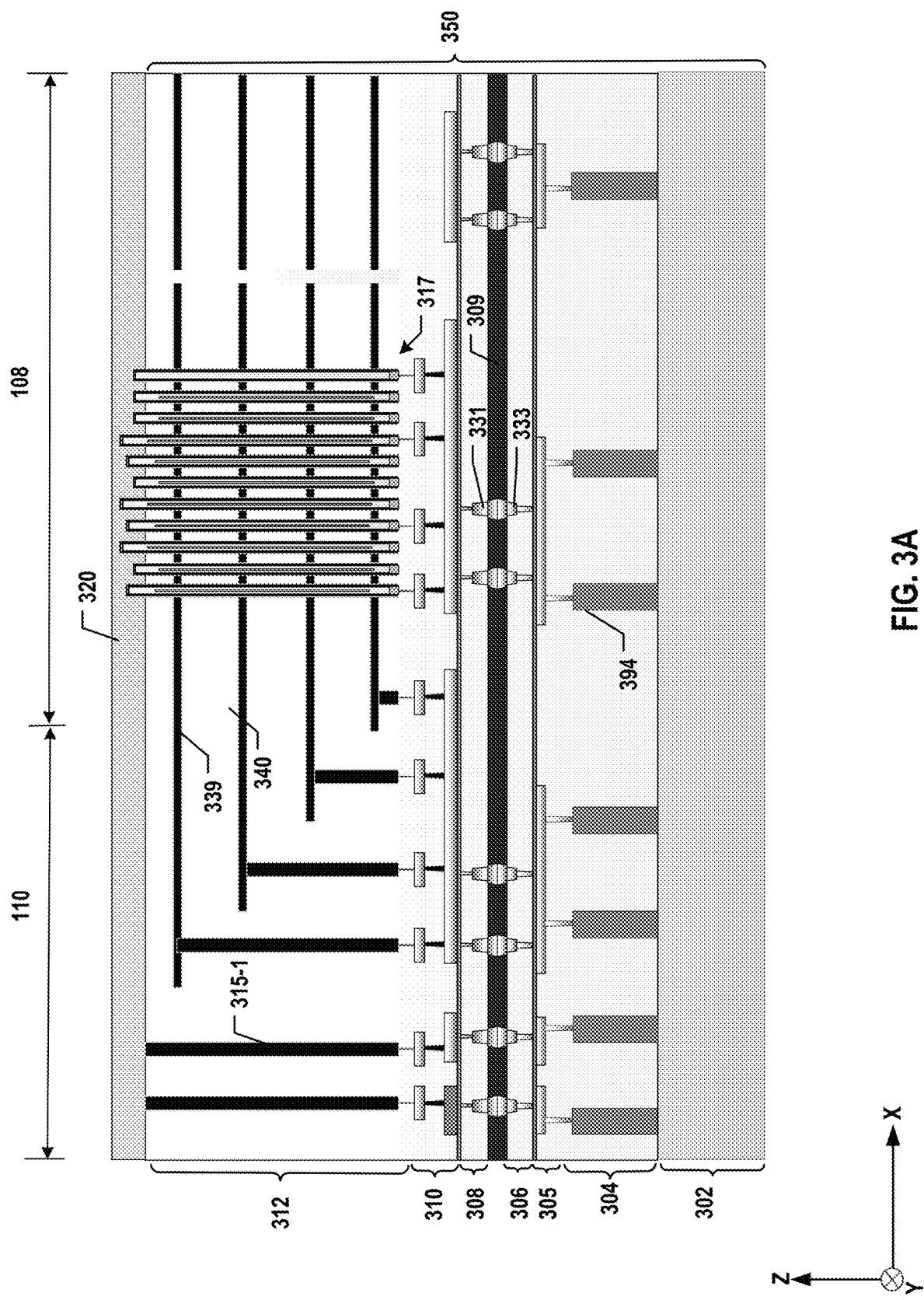
FIGS. 3A-3N illustrate a fabrication process for forming the 3D memory devices in FIG. 2, according to some aspects of the present disclosure.
Figure 3B:
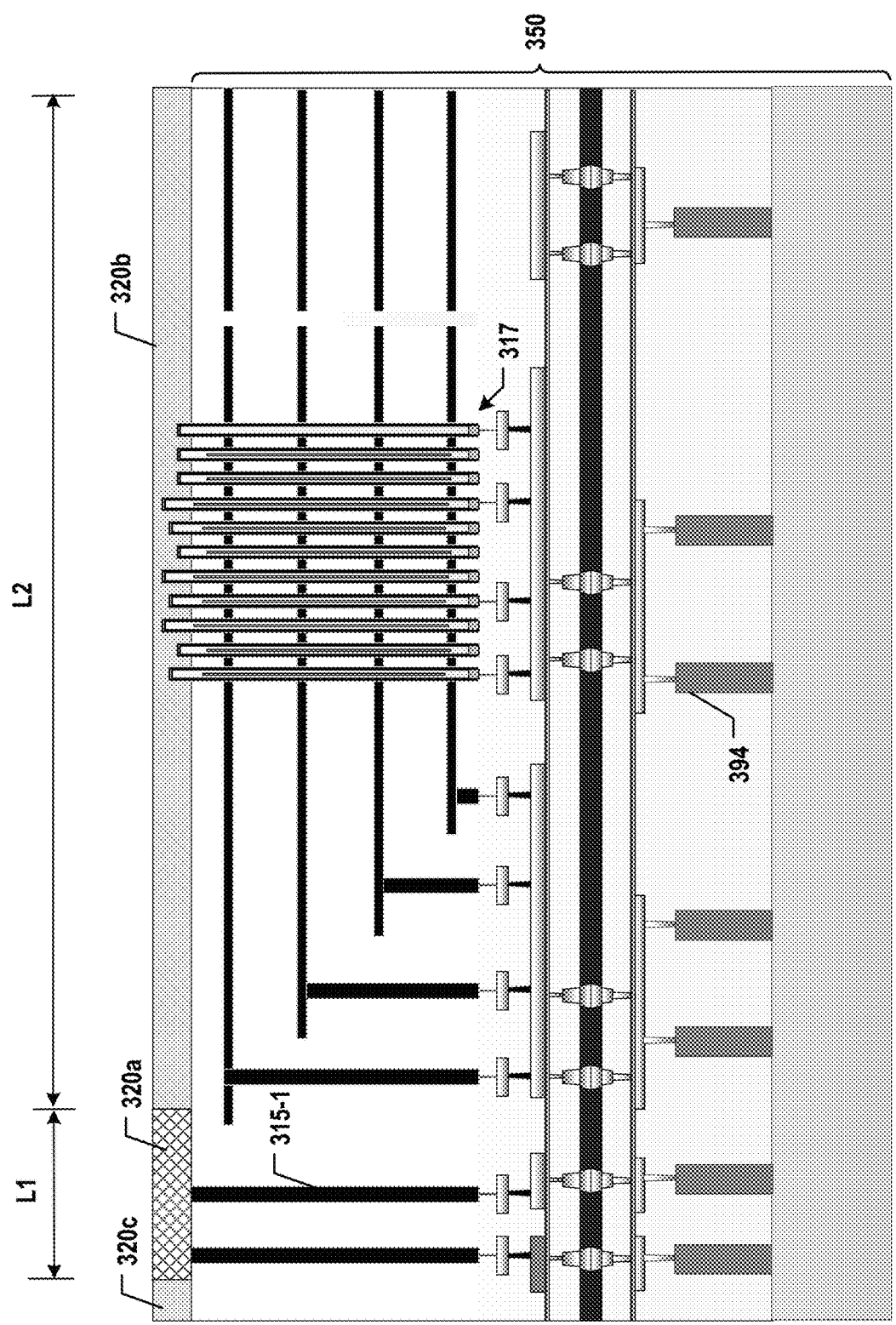
Figure 3C:
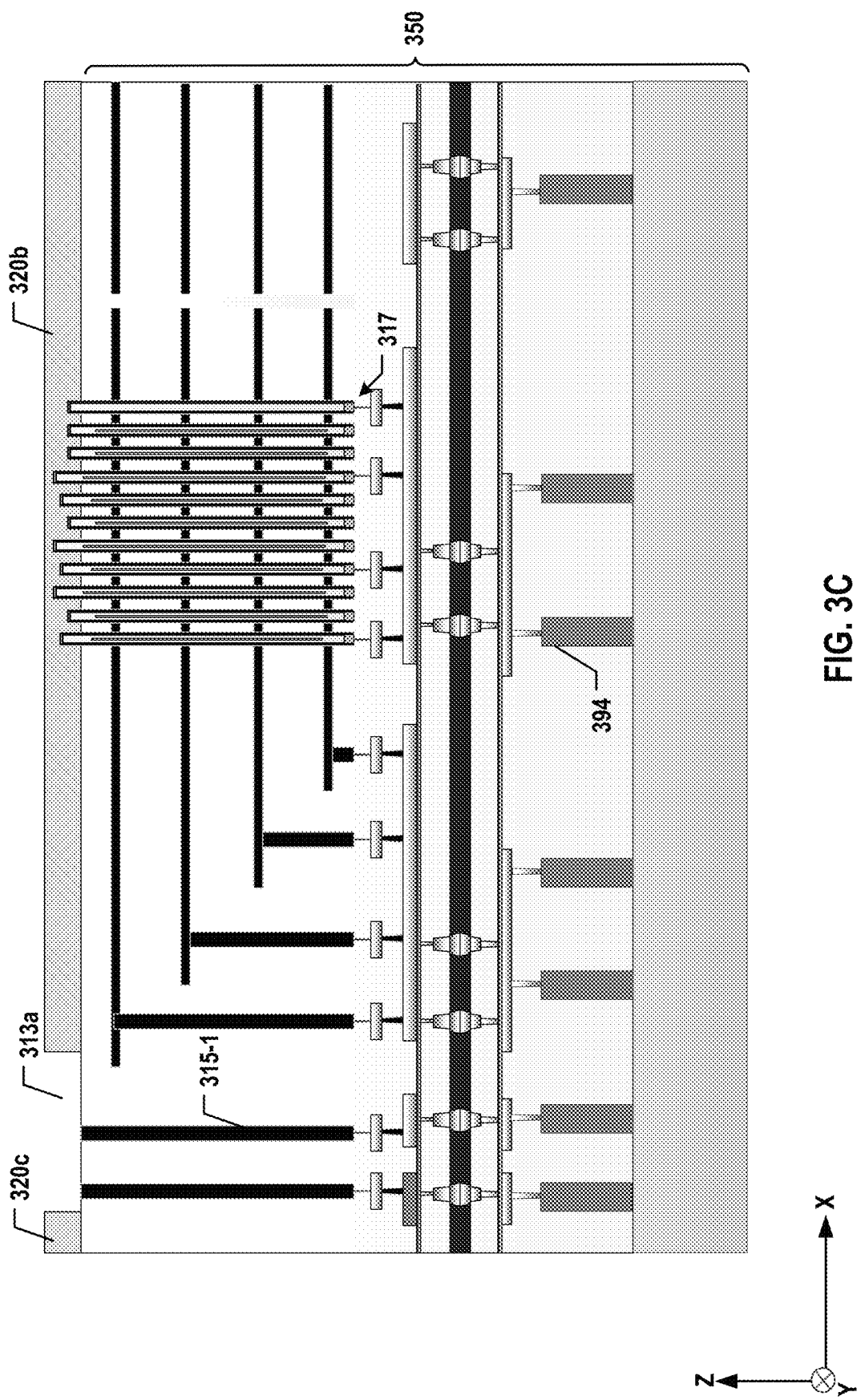
Figure 3D:
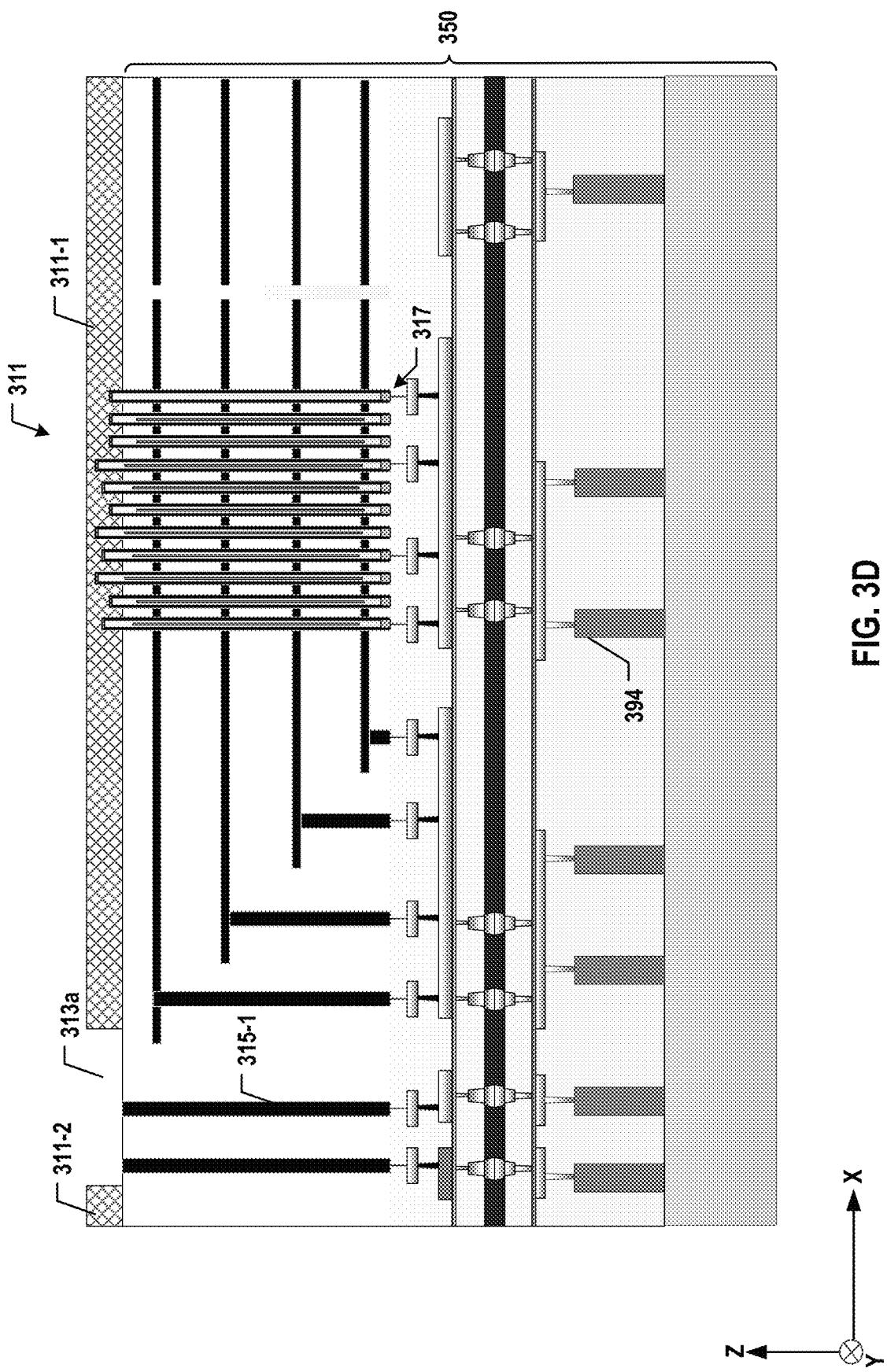

As shown in FIG. 1A, 3D memory device 100 can also include a second semiconductor structure 104 having the peripheral circuits of the memory cell array in first semiconductor structure 102. The peripheral circuits (a.k.a. control and sensing circuits) can include any suitable digital, analog, and/or mixed-signal circuits used for facilitating the operations of the memory cell array. For example, the peripheral circuits can include one or more of a page buffer, a decoder (e.g., a row decoder and a column decoder), a sense amplifier, a driver (e.g., a word line driver), an I/O circuit, a charge pump, a voltage source or generator, a current or voltage reference, any portions (e.g., a sub-circuit) of the functional circuits mentioned above, or any active or passive components of the circuit (e.g., transistors, diodes, resistors, or capacitors). The peripheral circuits in second semiconductor structure 104 can use complementary metaloxide-semiconductor (CMOS) technology, e.g., which can be implemented with logic processes in any suitable technology nodes.

As shown in FIG. 1A, first and second semiconductor structures 102 and 104 are stacked over one another in different planes, according to some implementations. As a result, the memory cell array in first semiconductor structure 102 and the peripheral circuits in second semiconductor structure 104 can be stacked over one another in different planes to reduce the planar size of 3D memory device 100, compared with memory devices in which all the peripheral circuits are disposed in the same plane. As shown in FIG. 1A, in some implementations, first semiconductor structure 102 is above second semiconductor structure 104 and includes a pad-out interconnect layer for pad-out purposes. TSVs may be formed extending in first semiconductor structure 102, providing electrical connection between components in memory device 100 (e.g., the peripheral circuits and/or the memory cell array) and any external circuitry.

As shown in FIG. 1A, 3D memory device 100 further includes a bonding interface 106 vertically between first semiconductor structure 102 and second semiconductor structure 104. Bonding interface 106 can be an interface between two semiconductor structures formed by any suitable bonding technologies as described below in detail, such as hybrid bonding, anodic bonding, fusion bonding, transfer bonding, adhesive bonding, eutectic bonding, to name a few. Data transfer between the memory cell array in first semiconductor structure 102 and the peripheral circuit in second semiconductor structure 104 can be performed through the interconnects (e.g., bonding contacts) across bonding interface 106. As shown in FIG. 1A, in some implementations, in the z-direction, the memory cell array is above bonding interface 106, and the peripheral circuit is below bonding interface 106.

As described below in detail, some of first and second semiconductor structures 102 and 104 can be fabricated separately (and in parallel in some implementations) by the parallel process, such that the thermal budget of fabricating one of first and second semiconductor structures 102 and 104 does not limit the processes of fabricating another one of first and second semiconductor structures 102 and 104. Moreover, a large number of interconnects (e.g., bonding contacts and/or inter-layer vias (ILVs)/through substrate vias (TSVs)) can be formed across bonding interface 106 to make direct, short-distance (e.g., micron- or submicron-level) electrical connections between adjacent semiconductor structures 102 and 104.

FIG. 1B illustrates an overview of memory device 100, according to some aspects of the present disclosure. Specifically, FIG. 1B shows a core region 108 and a non-array region 110 in first semiconductor structure 102, in the x-y plane. In some implementations, the memory cell array is formed in core region 108, and the TSCs are formed in non-array region 110. In some implementations, non-array region 110 is located in the outer periphery of core region 108 or surrounds core region 108. For example, non-array region 110 may be a region away from the memory cell arrays, e.g., a staircase region. In various implementations, other regions may be included in non-array region 110 but is not part of the staircase region. In some implementations, in the x-y plane, non-array region 110 and core region 108 do not overlap with each other.

Figure 1C:
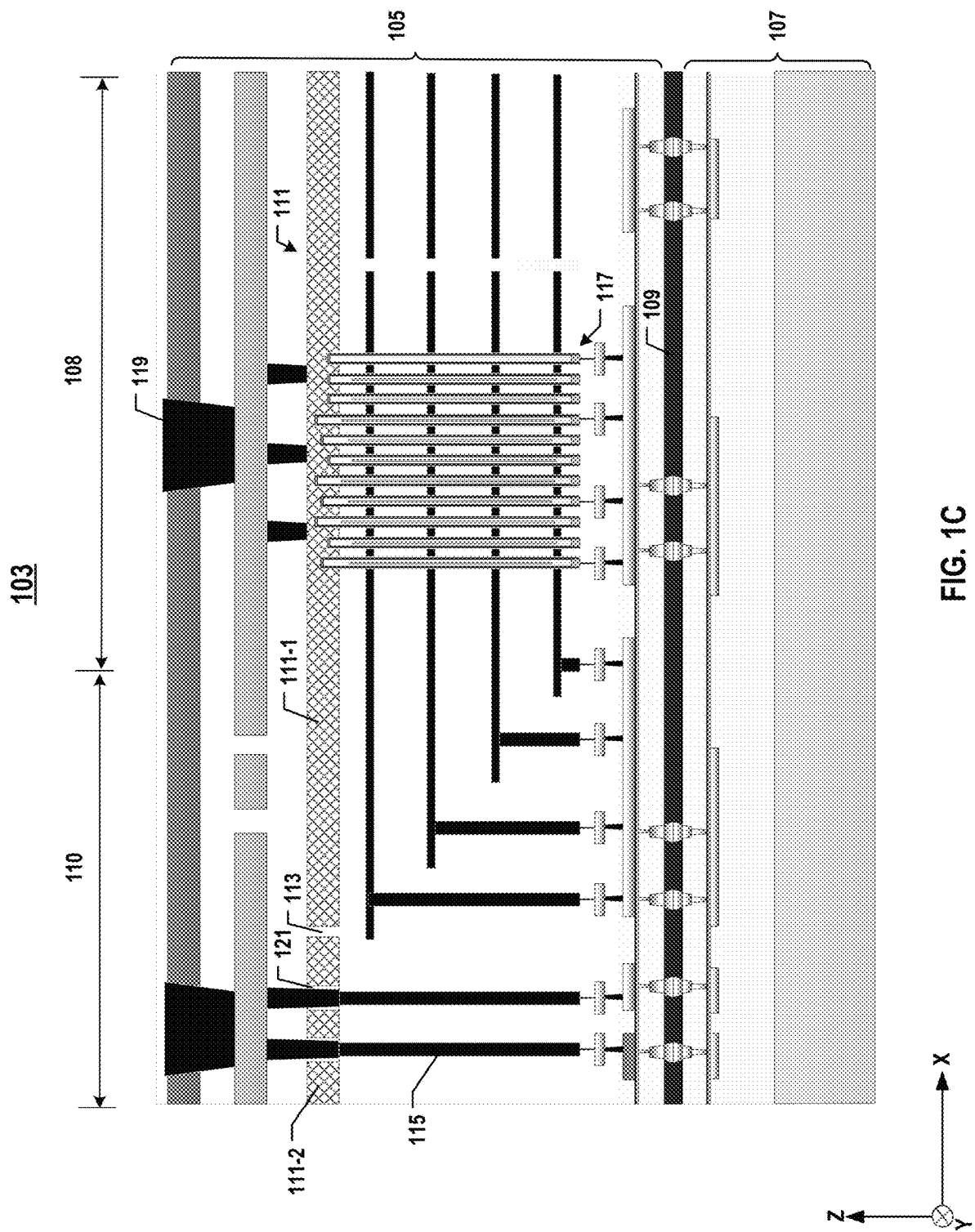
FIG. 1C illustrates a side view of an example of a 3D memory device in FIGS. 1A and 1B.

FIG. 1C illustrates a side view of part of a 3D memory device 103, which is an example of memory device 100. 3D memory device includes a first semiconductor structure 105 and a second semiconductor structure 107, bonded with each other at a boding interface 109. First semiconductor structure 105 is an example of first semiconductor structure 102, and second semiconductor structure 107 is an example of second semiconductor structure 104. First semiconductor structure 105 includes a plurality of NAND memory strings 117, a plurality of TSCs 115, a semiconductor layer 111, and a plurality of pad-out interconnects 119. Source ends of NAND memory strings 117, located in core region 108, are in contact with a first portion of semiconductor layer 111-1. A second portion of semiconductor layer 111-2 is insulated/disconnected from first portion of semiconductor layer 111-1 by an insulating portion 113, which includes a dielectric material such as silicon oxide. TSCs 115 may be located in non-array region 110 and extending through second portion of semiconductor layer 111-2. Pad-out interconnects 119 may be conductively connected to components in 3D memory device 103 for pad-out purposes. Each TSC 115 is in (e.g., through) a respective insulating spacer 121 in second portion of semiconductor layer 111-2. Insulating spacers 121 include the same material, e.g., silicon oxide, as insulating portion 113.

Insulating portion 113 and insulating spacers 121 are formed by patterning semiconductor layer 111 to form respective openings, and filling the openings with a dielectric material. The patterning process often includes a photolithography process followed by an etching process. The openings for forming insulating spacers 121 are for example precisely aligned with TSCs 115. Due to the small critical dimensions of insulating portion 113 and insulating spacers 121, the dielectric material is often deposited using ALD. The fabrication process to form 3D memory device 103 can thus be challenging and costly.

Figure 2:
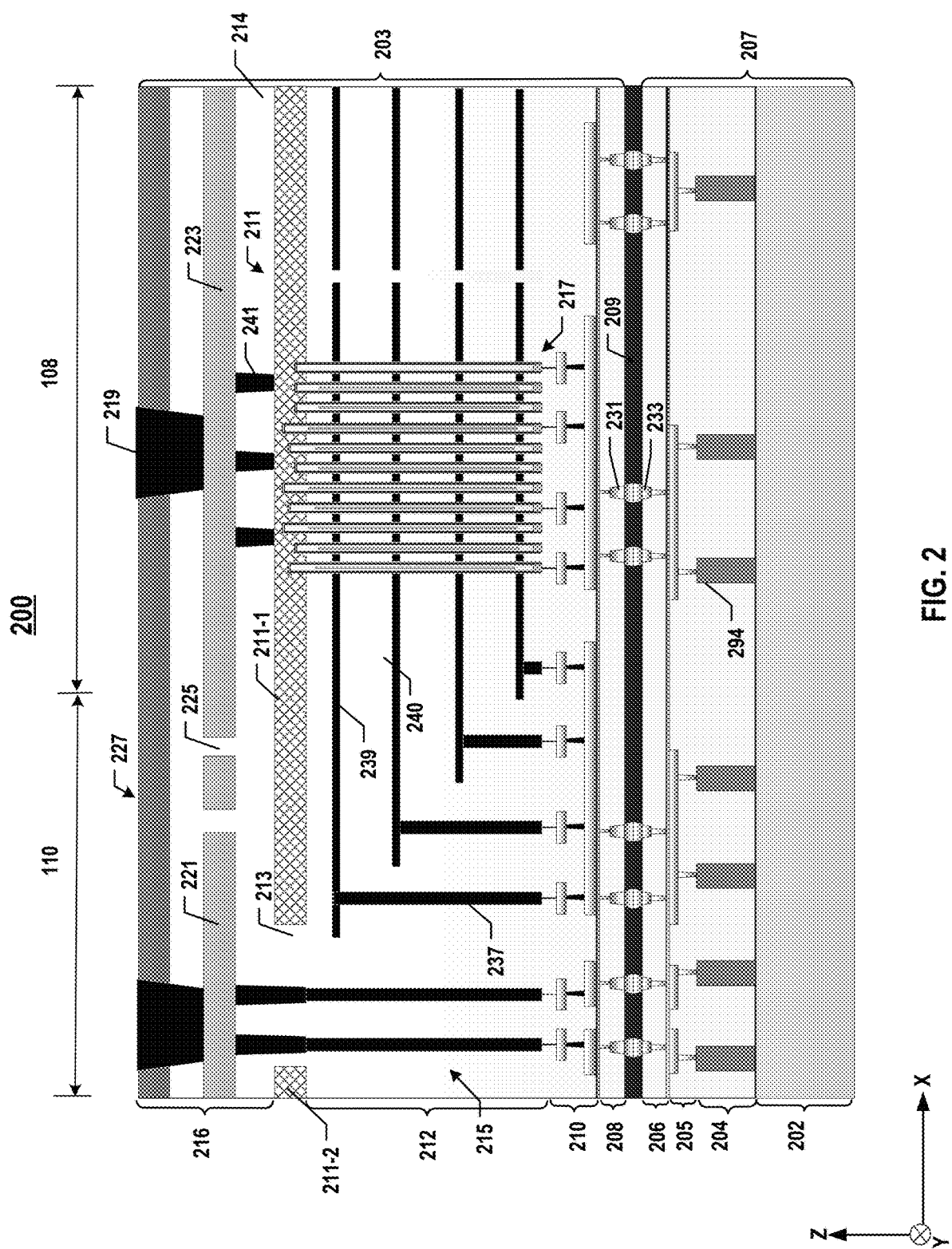
FIG. 2 illustrates a side view of an example of a 3D memory device in FIGS. 1A and 1B, according to some aspects of the present disclosure.

FIG. 2 illustrates a side view of part of an exemplary 3D memory device 200 in the x-z plane, according to some aspects of the present disclosure. 3D memory device 200 can be an example of memory device 100 and is a bonded chip including first semiconductor structure 203 and second semiconductor structure 207, stacked in different planes in the vertical direction (e.g., the z-direction), according to some implementations. First and second semiconductor structures 203 and 207 are bonded at bonding interface 209 therebetween, according to some implementations. It should be noted that, the components shown in FIG. 2, 3A-3N, 4A and 4B are meant for showing the relative positions and do not indicate the actual electrical connections in 3D memory device 200.

As shown in FIG. 2, first and second semiconductor structures 203 and 207 may be bonded to each other in a face-to-face manner at bonding interface 209. Second semiconductor structure 207 can include a substrate 202 and a device layer 204 above and in contact with substrate 202. Substrate 202 can include silicon (e.g., single crystalline silicon, c-silicon), silicon germanium (SiGe), gallium arsenide (GaAs), germanium (Ge), silicon on insulator (SOI), germanium on insulator (GOI), or any other suitable semiconductor materials. In some implementations, element 202 represents a semiconductor layer, which can be formed by thinning a substrate. In some implementations, substrate 202 includes single crystalline silicon. In some implementations, device layer 204 includes a peripheral circuit (details not shown in the figures). The peripheral circuit can include high voltage (HV) circuits, such as driving circuits, and low voltage (LV) circuits, such as page buffer circuits and logic circuits. In some implementations, the peripheral circuit includes a plurality of transistors 294 in contact with substrate 202 (or semiconductor layer 202, if applicable). The transistors 294 can include any transistors disclosed herein, such as planar transistors and 3D transistors.

In some implementations, second semiconductor structure 207 further includes an interconnect layer 205 above device layer 204 to transfer electrical signals to and from the peripheral circuit in device layer 204. As shown in FIG. 2, interconnect layer 205 can be vertically between bonding interface 209 and device layer 204 (including the transistors 294 of the peripheral circuit). Interconnect layer 205 can include a plurality of interconnects, including lateral lines and vias. As used herein, the term "interconnects" can broadly include any suitable types of interconnects, such as middle-end-of-line (MEOL) interconnects and back-end-of-line (BEOL) interconnects. Interconnects can be coupled to the transistors 294 of the peripheral circuit in device layer 204. Interconnect layer 205 can further include one or more interlayer dielectric (ILD) layers (also known as "intermetal dielectric (IMD) layers") in which the lateral lines and vias can form. That is, interconnect layer 205 can include lateral lines and vias in multiple ILD layers. In some implementations, the devices in device layer 204 are coupled to one another through the interconnects in interconnect layer 205. The interconnects in interconnect layer 205 can include conductive materials including, but not limited to, W, Co, Cu, Al, silicides, or any combination thereof. The ILD layers in interconnect layer 205 can include dielectric materials including, but not limited to, silicon oxide, silicon nitride, silicon oxynitride, low dielectric constant (low-k) dielectrics, or any combination thereof. In some implementations, the interconnects in interconnect layer 205 include W, which has a relatively high thermal budget (compatible with high-temperature processes) and good quality (fewer defects, e.g., voids) among conductive metal materials.

As shown in FIG. 2, second semiconductor structure 207 can further include a bonding layer 206 at bonding interface 209 and above and in contact with interconnect layer 205. Bonding layer 206 can include a plurality of bonding contacts 233 and dielectrics electrically isolating bonding contacts 233. Bonding contacts 233 can include conductive materials including, but not limited to, W, Co, Cu, Al, silicides, or any combination thereof In some implementations, bonding contacts 233 of bonding layer 206 include Cu. The remaining area of bonding layer 206 can be formed with dielectrics including, but not limited to, silicon oxide, silicon nitride, silicon oxynitride, low-k dielectrics, or any combination thereof. Bonding contacts 233 and surrounding dielectrics in bonding layer 206 can be used for hybrid bonding (also known as "metal/dielectric hybrid bonding"), which is a direct bonding technology (e.g., forming bonding between surfaces without using intermediate layers, such as solder or adhesives) and can obtain metal-metal (e.g., Cu-to-Cu) bonding and dielectric-dielectric (e.g., SiO2-to-SiO2) bonding simultaneously. For example, bonding interface may be distinguished based on the relative positions, e.g., shifts, of bonded contacts 231 and 233.

As shown in FIG. 2, first semiconductor structure 102 can further include a bonding layer 208 at bonding interface 209, e.g., on the opposite side of bonding interface 209 with respect to bonding layer 206 in second semiconductor structure 207. Bonding layer 208 can include a plurality of bonding contacts 231 and dielectrics electrically isolating bonding contacts 231. Bonding contacts 231 can include conductive materials, such as Cu. The remaining area of bonding layer 208 can be formed with dielectric materials, such as silicon oxide. Bonding contacts 231 and surrounding dielectrics in bonding layer 208 can be used for hybrid bonding. In some implementations, bonding interface 209 is the place at which bonding layers 208 and 206 are met and bonded. In practice, bonding interface 209 can be a layer with a certain thickness that includes the top surface of bonding layer 206 and the bottom surface of bonding layer 208.

As shown in FIG. 2, first semiconductor structure 203 can further include an interconnect layer 210 above and in contact with bonding layer 208 to transfer electrical signals. Interconnect layer 210 can include a plurality of interconnects, such as MEOL interconnects and BEOL interconnects. In some implementations, the interconnects in interconnect layer 210 also include local interconnects, such as bit line contacts and word line contacts. Interconnect layer 210 can further include one or more ILD layers in which the lateral lines and vias can form. The interconnects in interconnect layer 210 can include conductive materials including, but not limited to, W, Co, Cu, Al, silicides, or any combination thereof. The ILD layers in interconnect layer 210 can include dielectric materials including, but not limited to, silicon oxide, silicon nitride, silicon oxynitride, low-k dielectrics, or any combination thereof.

As shown in FIG. 2, first semiconductor structure 203 can include a memory cell array, such as an array of NAND memory strings 217 above and in contact with interconnect layer 210. In some implementations, interconnect layer 210 is vertically between NAND memory strings 217 and bonding interface 209. Each NAND memory string 217 extends vertically through a plurality of pairs of gate conductive layer 239 and dielectric layer 240, according to some implementations. The stacked and interleaved gate conductive layers 239 and dielectric layers 240 are also referred to herein as a stack structure, e.g., a memory stack 212 (conductive/dielectric layer pairs). The interleaved gate conductive layers 239 and dielectric layers 240 in memory stack 212 alternate in the vertical direction, according to some implementations. Each gate conductive layer 239 can include a gate electrode (gate line) surrounded by an adhesive layer and a gate dielectric layer. The adhesive layer can include conductive materials, such as titanium nitride (TiN), which can improve the adhesiveness between the gate electrode and the gate dielectric layer. The gate electrode of gate conductive layer 239 can extend laterally as a word line, ending at one or more staircase structures of memory stack 212. The staircase structures, located in staircase region, which is part of non-array region 110, may be in contact with a plurality of word line contacts 237 for applying voltages on gate conductive layers 239.

The number of the pairs of gate conductive layers 239 and dielectric layers 240 in memory stack 212 can be one of the factors that determine the number of memory cells in the memory cell array. Gate conductive layer 239 can include conductive materials including, but not limited to, tungsten (W), cobalt (Co), copper (Cu), aluminum (Al), polysilicon, doped silicon, silicides, or any combination thereof. In some implementations, each gate conductive layer 239 includes a metal layer, such as a tungsten layer. In some implementations, each gate conductive layer 239 includes a doped polysilicon layer. Each gate conductive layer 239 can include control gates surrounding the memory cells.

As shown in FIG. 2, each NAND memory string 217 includes a channel structure extending vertically through memory stack 212. In some implementations, the channel structure includes a channel hole filled with semiconductor material(s) (e.g., as a semiconductor channel) and dielectric material(s) (e.g., as a memory film). In some implementations, the semiconductor channel includes silicon, such as polysilicon. In some implementations, the memory film is a composite dielectric layer including a tunneling layer, a storage layer (also known as a "charge trap/storage layer"), and a blocking layer. The channel structure can have a cylinder shape (e.g., a pillar shape). The semiconductor channel, the tunneling layer, the storage layer, the blocking layer are arranged radially from the center toward the outer surface of the pillar in this order, according to some implementations. The tunneling layer can include silicon oxide, silicon oxynitride, or any combination thereof. The storage layer can include silicon nitride, silicon oxynitride, silicon, or any combination thereof. The blocking layer can include silicon oxide, silicon oxynitride, high dielectric constant (high-k) dielectrics, or any combination thereof. In one example, the memory film may include a composite layer of silicon oxide/silicon oxynitride/silicon oxide (ONO). The channel structure can further include a channel plug on the drain end of NAND memory string 217. The channel plug can include polysilicon and be in contact with the semiconductor channel. In some implementations, each NAND memory string 217 is a "charge trap" type of NAND memory. It is understood that NAND memory strings 217 are not limited to the "charge trap" type of NAND memory strings and may be "floating gate" type of NAND memory strings in other examples.

NAND memory string 217 is free of any semiconductor plug on the source end thereof, according to some implementations. Instead, 3D memory device 200 includes a semiconductor layer 211 above and in contact with memory stack 212. Semiconductor layer 211 can be in contact with the sidewall of the semiconductor channel of the channel structure at the source end of each NAND memory strings 217. Semiconductor layer 211 can include semiconductor materials, such as doped polysilicon. In some implementations, semiconductor layer 211 is doped with N-type dopants such as phosphorus and/or arsenic. A thickness of semiconductor layer 211 may be in a range of 100 nm to 600 nm. In some implementations, semiconductor layer 211 and a source contact in a slit structure (e.g., array common source or ACS, not shown) may collectively function as parts of a source line (not shown) coupled to the source ends of NAND memory string 217, for example, for applying an erase voltage to the source ends of NAND memory string 217 during erase operations.

Semiconductor layer 211 includes a first portion of semiconductor layer 211-1 and a second semiconductor layer 211-2, positioned at the same level in the z-direction and separated by an insulating layer 213. Insulating layer 213 may laterally be in contact with each of first and second portions of semiconductor layers 211-1 and 211-2, and may have the same thickness as semiconductor layer 211. First and second portions of semiconductor layer 211-1 and 211-2 may be disconnected/insulated from each other by insulating layer 213. In some implementations, insulating layer 213 is a single insulating layer that includes consistent medium/material in the x-y plane. That is, insulating layer 213 may not be disconnected between any two contact structures 215. First portion of semiconductor layer 211-1, partially or totally located in core region 108, may be above and in contact with the source ends of NAND memory strings 217. An area of first portion of semiconductor layer 211-1 may be sufficiently large, e.g., larger than or equal to the total area (e.g., a sub-region of core region 108) in which all NAND memory strings 217 are formed, to be in contact with the source ends of all NAND memory strings 217. The orthographic projection of insulating layer 213 in the x-y plane may cover a plurality, e.g., all, contact structure 215. In various implementations, the orthographic projection of insulaing layer 213 is at least partially overlapped with the staircase region. In some implementations, the orthographic projection of insulaing layer 213 has no overlap with core region 108. Second portion of semiconductor layer 211-2 may or may not exist in various implementations. In some implementations, a top surface of insulating layer 213 is coplanar with a top surface of semiconductor layer 211, and a bottom surface of insulating layer 213 is coplanar with a bottom surface of semiconductor layer 211. Insulating layer 213 may include a dielectric material such as silicon oxide, silicon nitride, and/or silicon oxynitride. In some implementations, insulating layer 213 includes silicon oxide.

As shown in FIG. 2, first semiconductor structure 203 can further include one or more contact structures 215 extending vertically in, e.g., through, insulating layer 213. In some implementations, contact structures 215 couples the interconnects in interconnect layer 210 to pad-out interconnects 219 in pad-out interconnect layer 216 to facilitate electrical connection through first semiconductor structure 203. Contact structures 215 can include conductive materials including, but not limited to, W, Co, Cu, Al, silicides, or any combination thereof. In some implementations, contact structures 215 include W. In some implementations, contact structures 215 each may be a TSV having a depth, e.g., length along the z-direction, in the micron- or tens micron-level (e.g., between 1 μm and 100 μm).

As shown in FIG. 2, contact structures 215 may be located in non-array region 110 of first semiconductor structur 203 or may be located away, e.g., in the x-y plane, from NAND memory strings 217. In some implementations, insulating layer 213 may be partially or fully located in non-array region 110 to provide insulation of at least one contact structure 215 from semiconductor layer 211. In some implementations, insulating layer 213 is located in the staircase region of 3D memory device 200. In some other implementations, insulating layer 213 is located outside the staircase region but in non-array region 110. In some implementations, a width of insulating layer 213 in the x-direction and/or y-direction is sufficiently large to enclose a plurality of, e.g., all, contact structures 215 in non-array region 110 such that all contact structures 215 surrounded/in insulating layer 213 are insulated from first portion of semiconductor layer 211-1. Insulating layer 213 may also insulate second portion of semiconductor layer 211-2, if any, from first portion of semiconductor layer 211-1. In various implementations, insulating layer 213 may be away from the source ends of NAND memory strings 217 and the width and/or area of insulating layer 213 can be desirably large to insulate a maximum number of contact structures 215. For example, an area (e.g., a sub-region of non-array region 110) of insulating layer 213 may be greater than or equal to the total area in which contact structures 215 are located. In some implementations, insulating layer 213 is located in non-array region 110.

As shown in FIG. 2, first semiconductor structure 203 can further include a pad-out interconnect layer 216 above and in contact with semiconductor layer 211. In some implementations, semiconductor layer 211 is disposed vertically, in the z-direction, between pad-out interconnect layer 216 and NAND memory strings 217. Pad-out interconnect layer 216 can include a second insulating layer 214 above and in contact with semiconductor layer 211 and insulating layer 213, a plurality of contacts 241 above and in contact with first portion of semiconductor layer 211-1, a first contact layer 221 above and in contact with contact structures 215, a second contact layer 223 above and in contact with contacts 241, a third insulating layer 227 above and in contact with first and second contact layers 221 and 223, and a plurality of pad-out interconnects 219, e.g., contact pads, in third insulating layer 227. In some implementations, pad-out interconnects 219 conductively connected to contact structures 215 are employed to drive the transistors 294 in the peripheral circuit in device layer 204. In some implementations, pad-out interconnects 219 conductively connected to NAND memory strings 217 are employed to provide voltages for operations of the memory cells such as erase, write, and read.

Second insulating layer 214 may provide insulation amongst contact structures 215 and contacts 241. First contact layer 221, in contact with contact structures 215 and respective pad-out interconnects 219, may provide electrical connection between contact structures 215 and the respective pad-out interconnects 219. Second contact layer 223, in contact with contacts 241 and respective pad-out interconnects 219, may provide electrical connection between the source ends of NAND memory strings 217 and the respective pad-out interconnects 219. First and second contact layers 221 and 223 may be insulated from each other, e.g., by one or more insulating portions 225. In some implementations, pad-out interconnects 219 can transfer electrical signals between 3D memory device 200 and external devices, e.g., for pad-out purposes. In some implementations, second insulating layer 214, insulating portions 225, and third insulating layer 227 may each include a dielectric material such as silicon oxide, silicon nitride, silicon oxynitride, a low-k dielectric material, or any combination thereof. Each of second insulating layer 214 and third insulating layer 227 may be a single-layered structure or a multi-layered structure. For example, third insulating layer 227 may include a silicon nitride layer over a silicon oxide layer. The silicon oxide layer may be in contact with first and second contact layers 221 and 223, and the silicon nitride layer may cover the silicon oxide layer. The silicon oxide layer may provide balanced stress on the first and second contact layers and the silicon nitride layer. The silicon nitride layer may provide desired insulation against contamination such as moist, air, and/or chemicals. Contact structures 215, contacts 241, first and second contact layers 221 and 223, and pad-out interconnects 219 may each include tungsten (W), cobalt (Co), copper (Cu), aluminum (Al), polysilicon, doped silicon, silicides, or any combination thereof. In some implementations, contact structures 215, contacts 241, and pad-out interconnects 219 may each include tungsten.

It should be noted that, although second insulating layer 214 and insulating layer 213 may include the same material and the interface between second insulating layer 214 and insulating layer 213 may not be visible, e.g., difficult to distinguish, second insulating layer 214 and insulating layer 213 may be defined as two different layers in the present disclosure. For example, if insulating layer 213 and second insulating layer 214 include the same material(s), insulating layer 213 may be the portion of the material(s) in contact with semiconductor layer 211 laterally (e.g., on the side surfaces of semiconductor layer 211), and second insulating layer 214 may be the portion of the material(s) in contact with semiconductor layer 211 and insulating layer 213 vertically (e.g., on the top surfaces of semiconductor layer 211 and insulating layer 213). That is, the interface between semiconductor layer 211 and insulating layer 213 may extend in the z-direction, and the interface between semiconductor layer 211/insulating layer 213 and second insulating layer 214 may extend in the x-y plane.

Figure 3E:
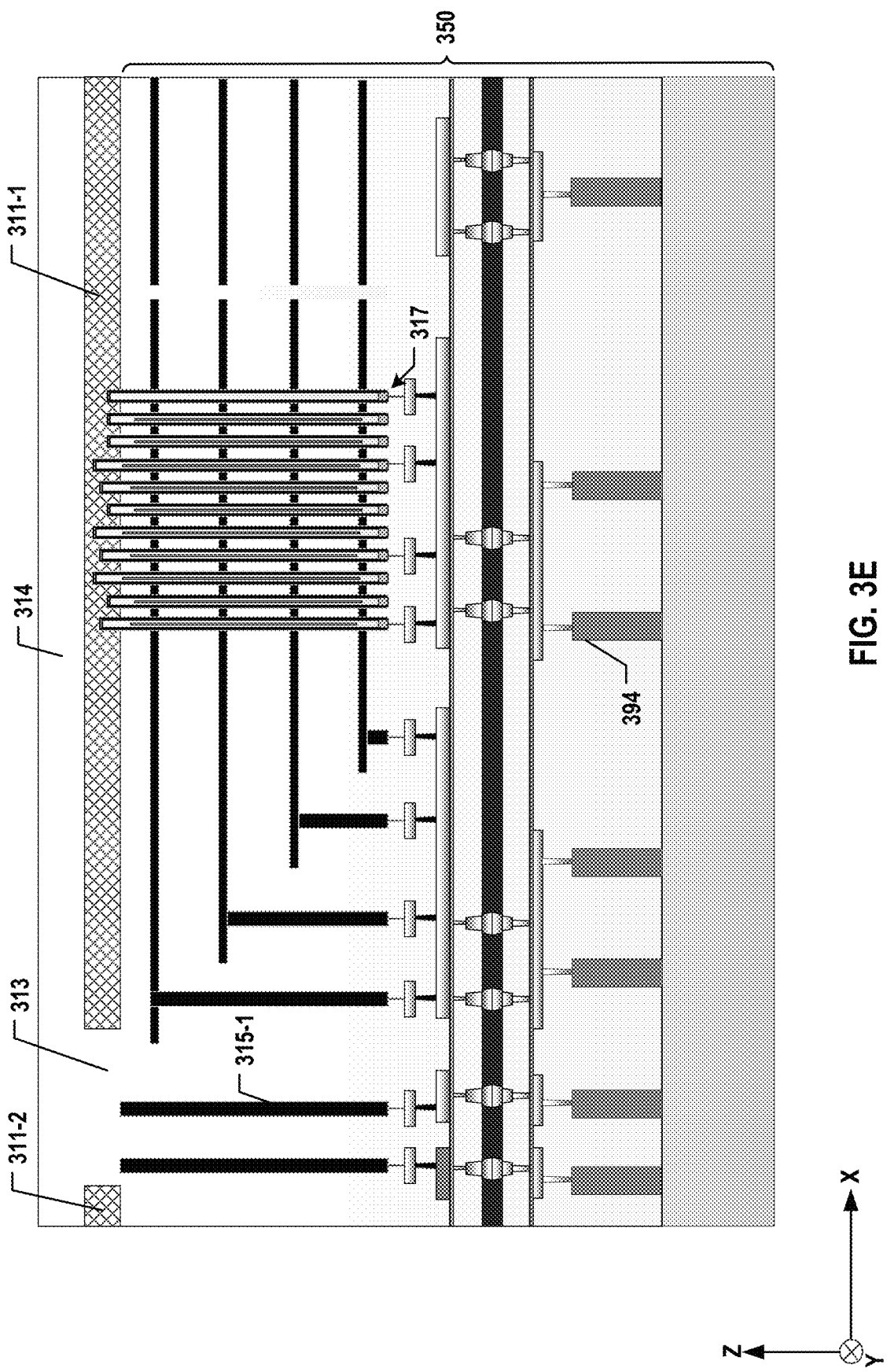
Figure 3F:
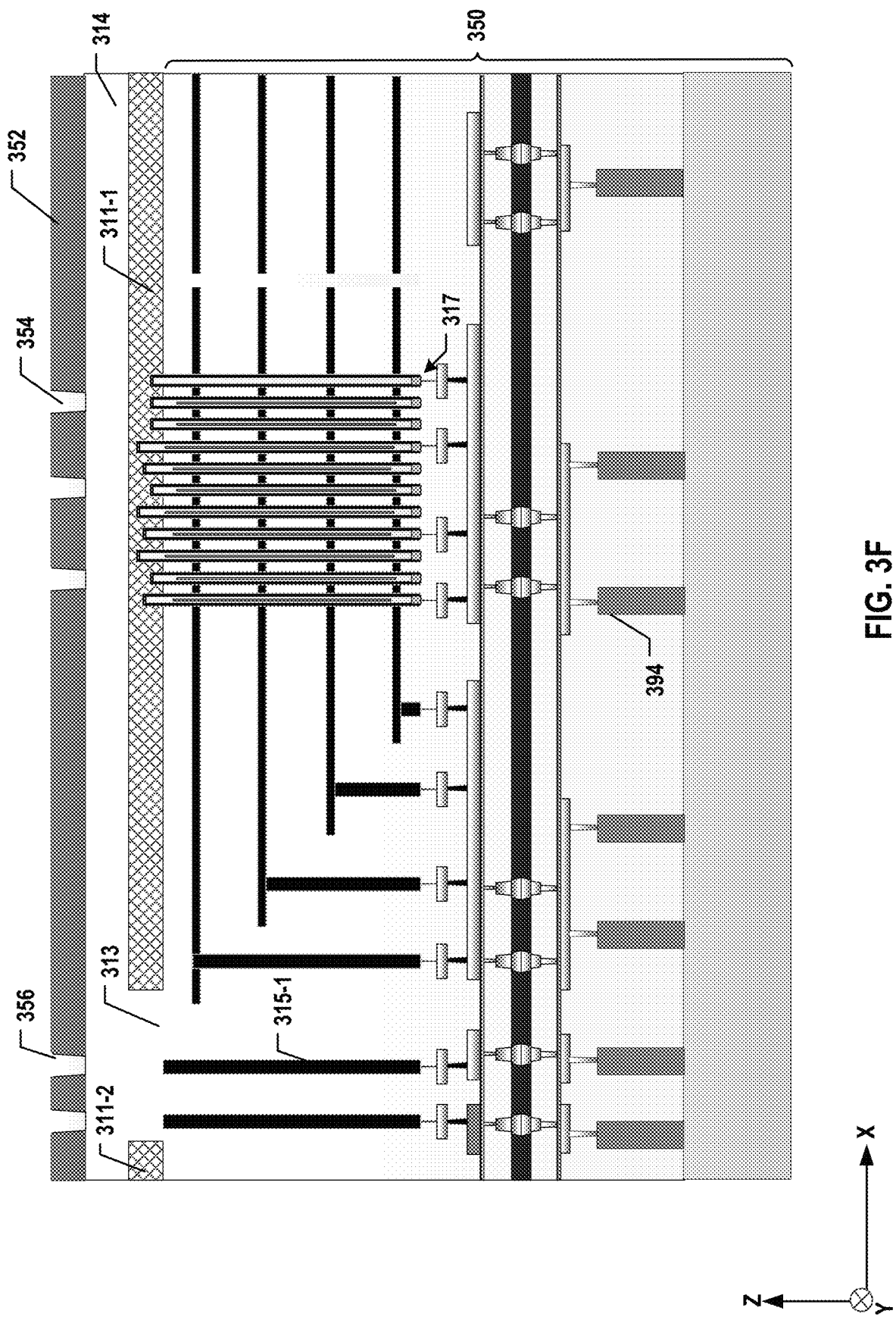
Figure 3G:
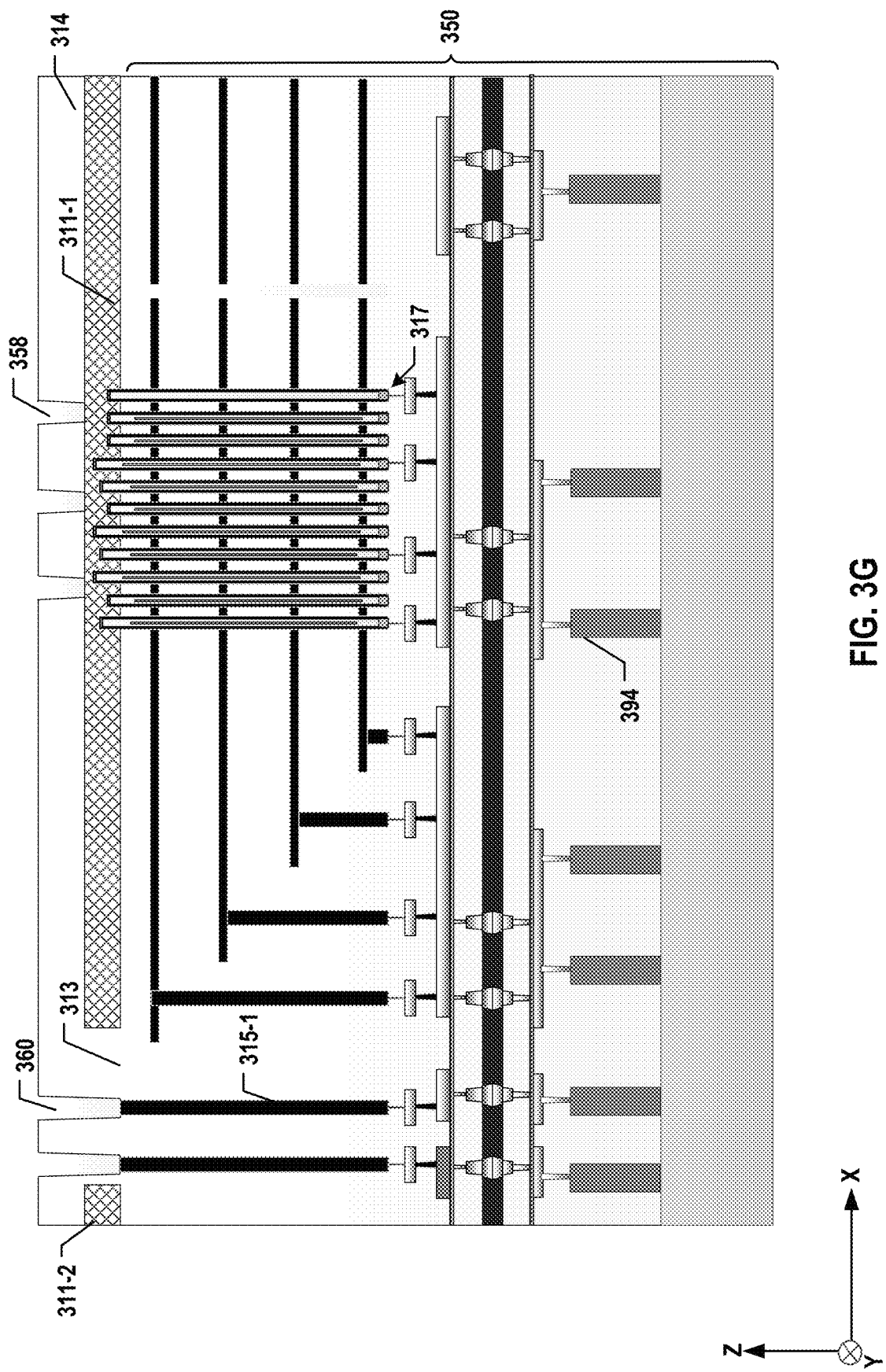
Figure 3H:
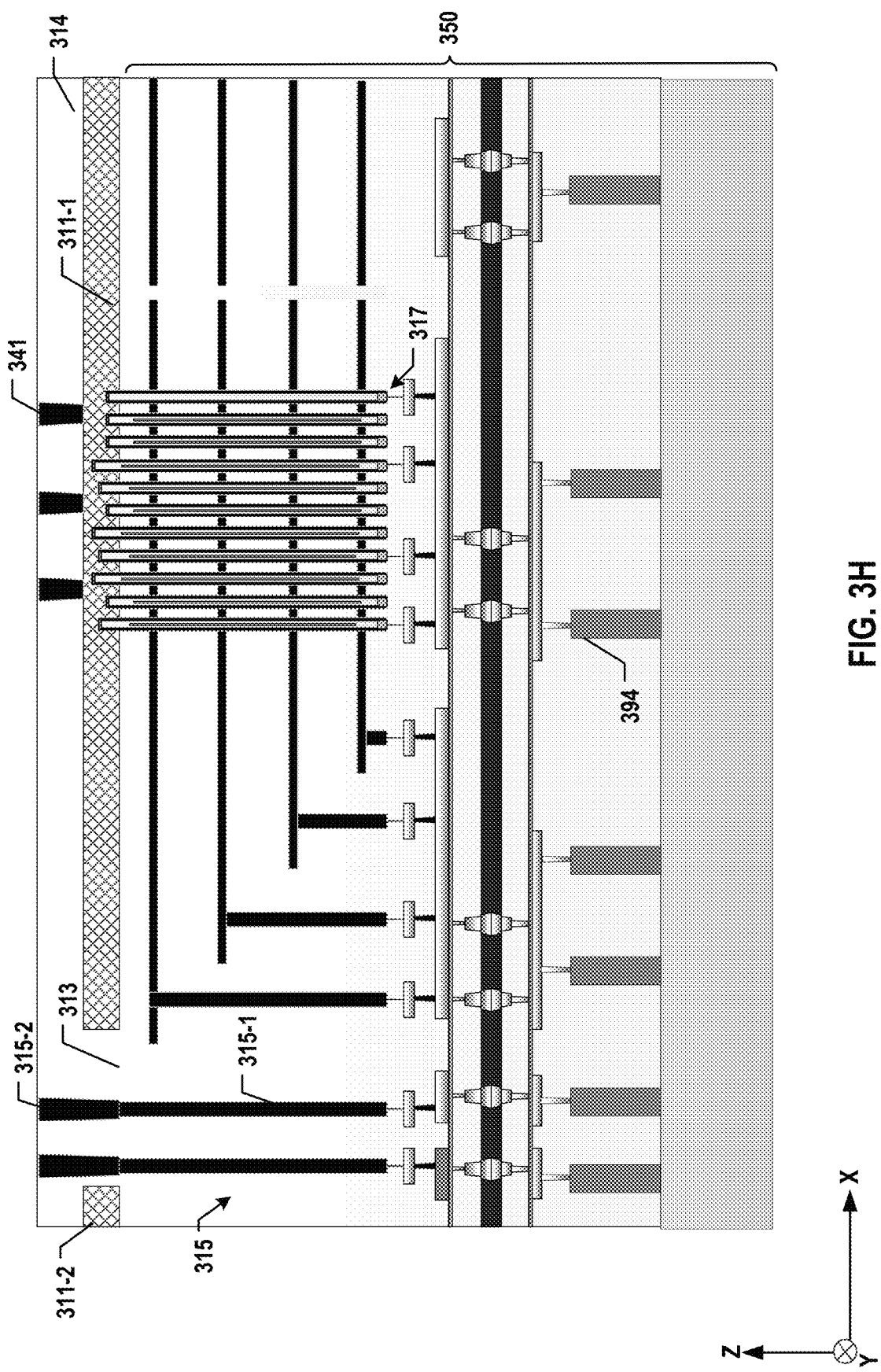
Figure 3I:
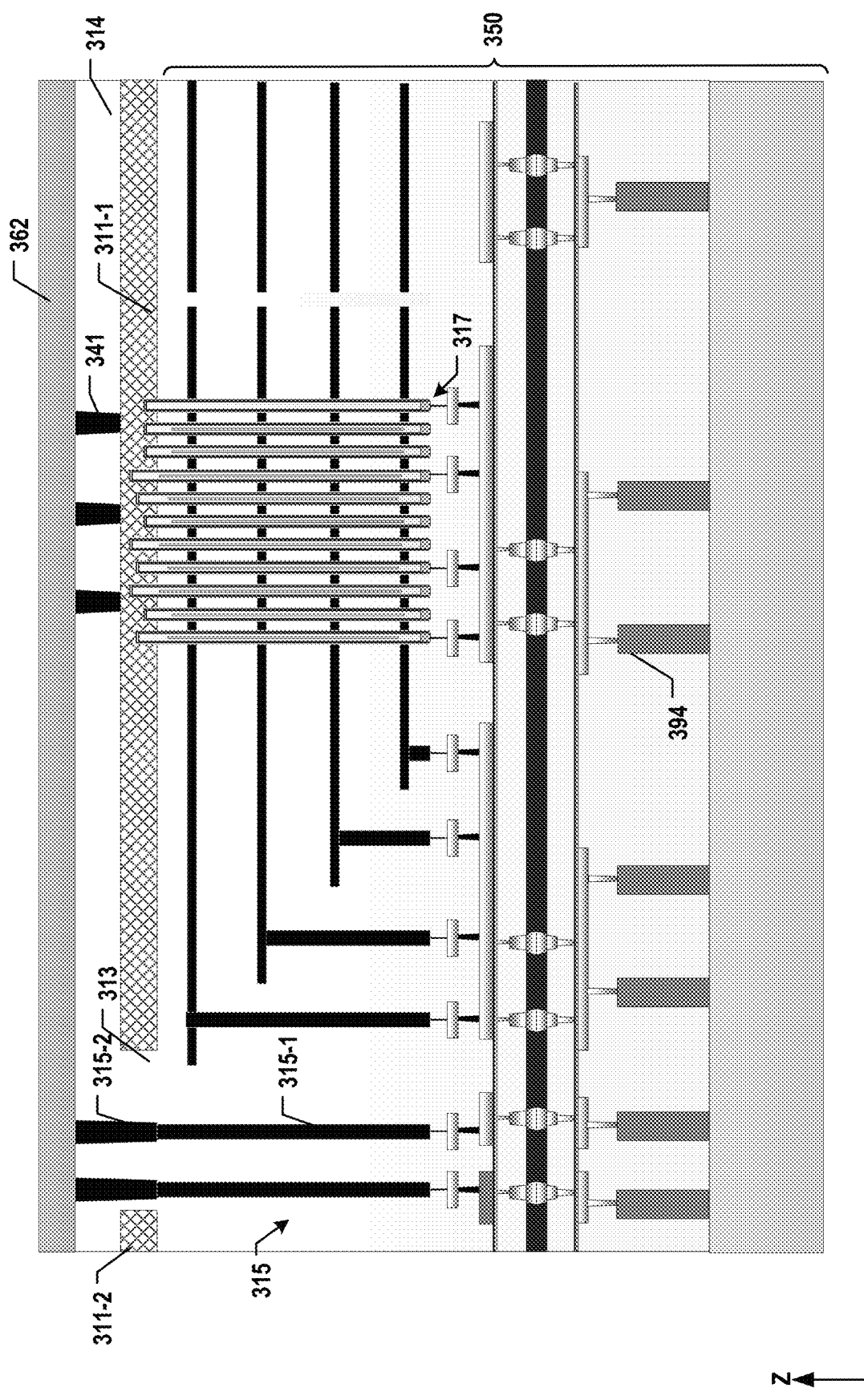
Figure 3J:
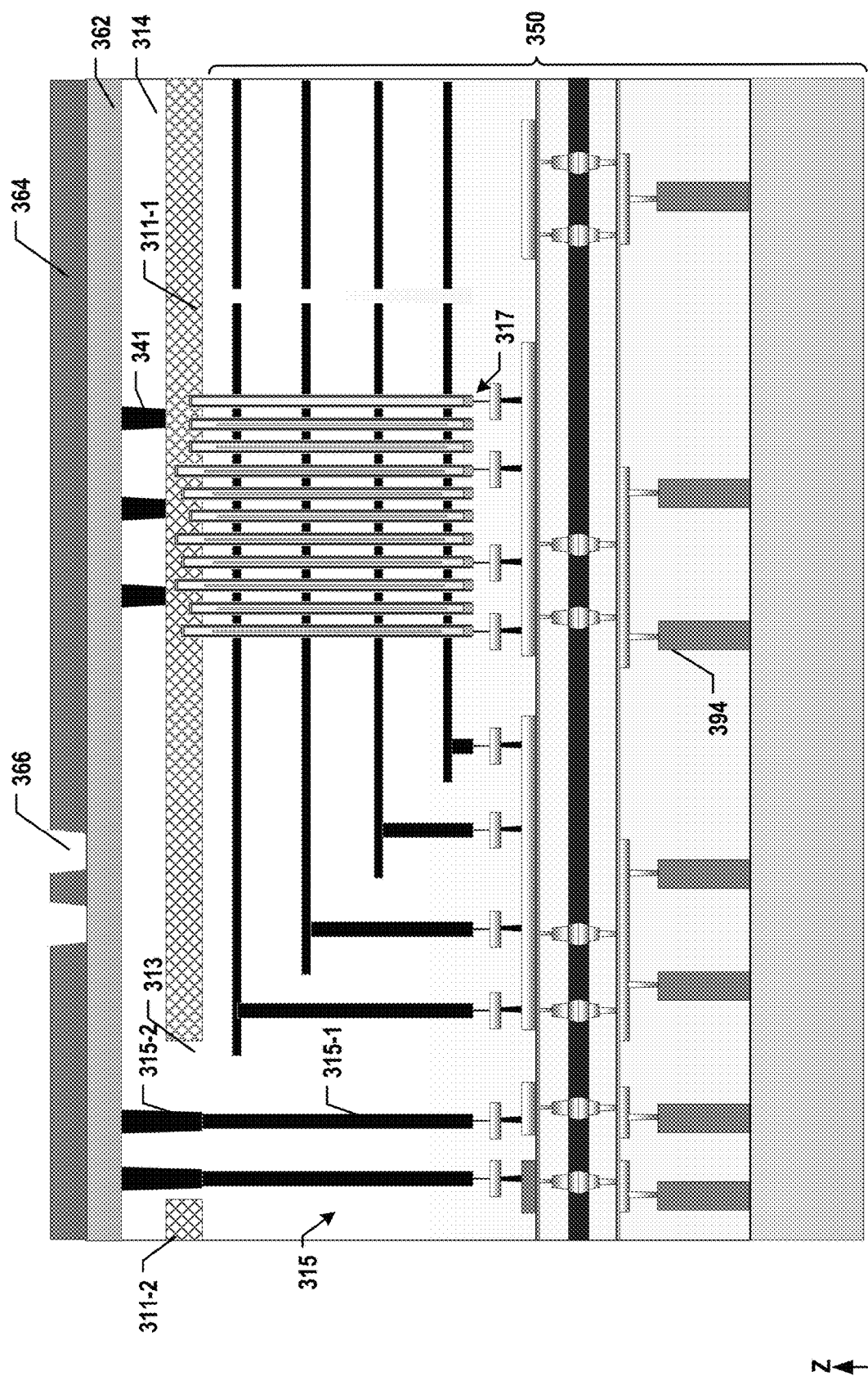
Figure 3K:
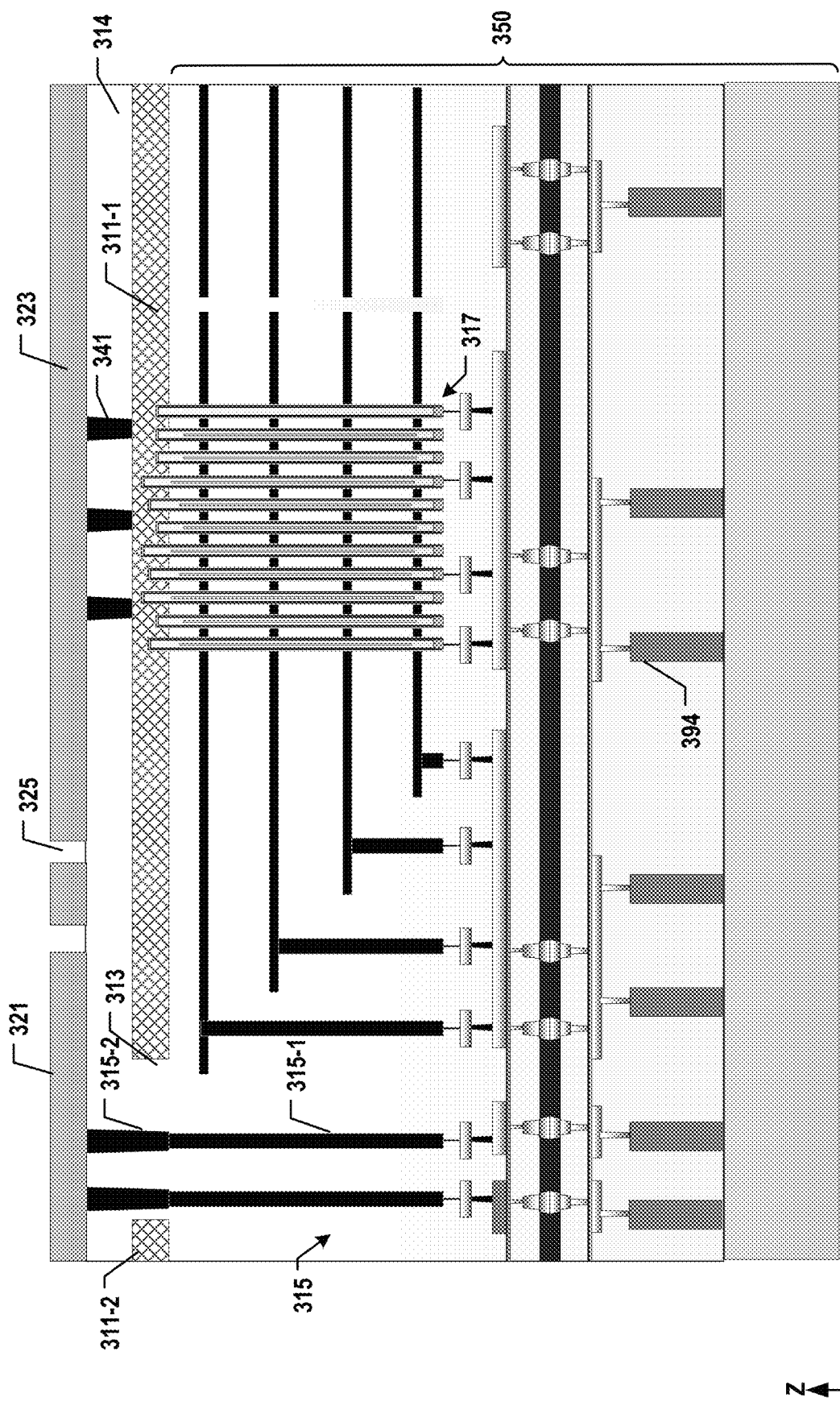
Figure 3L:
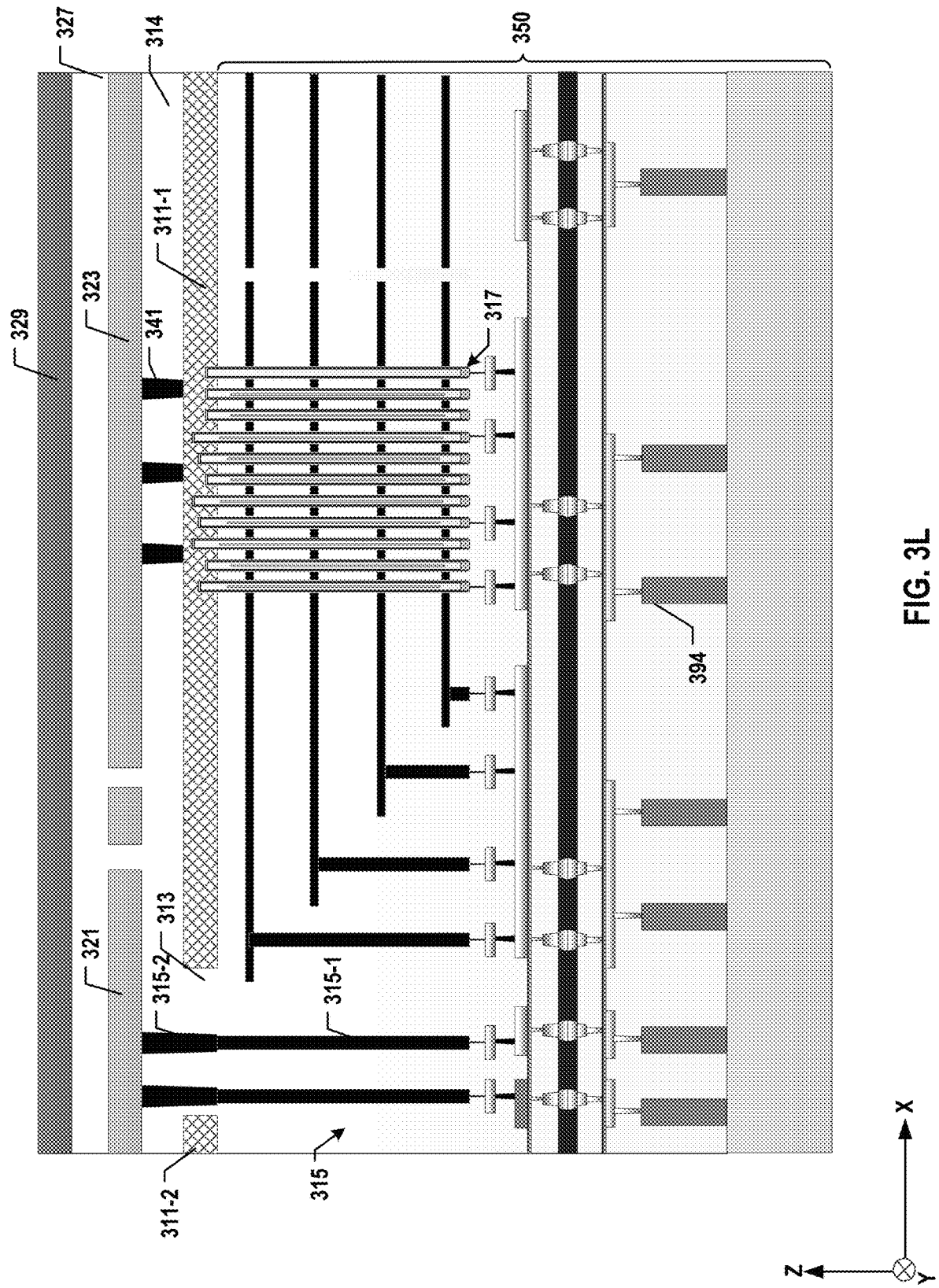
Figure 3M:
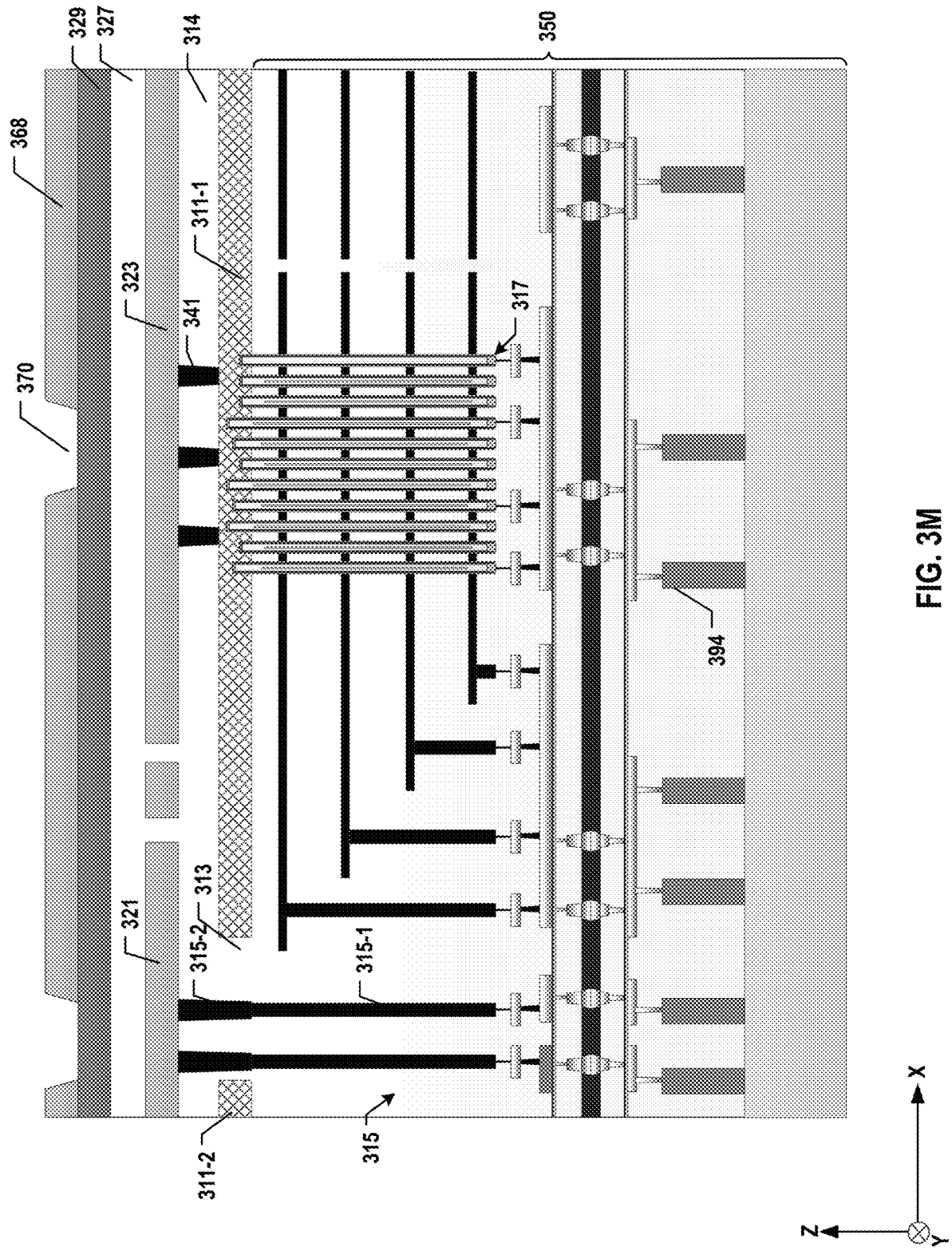
Figure 3N:
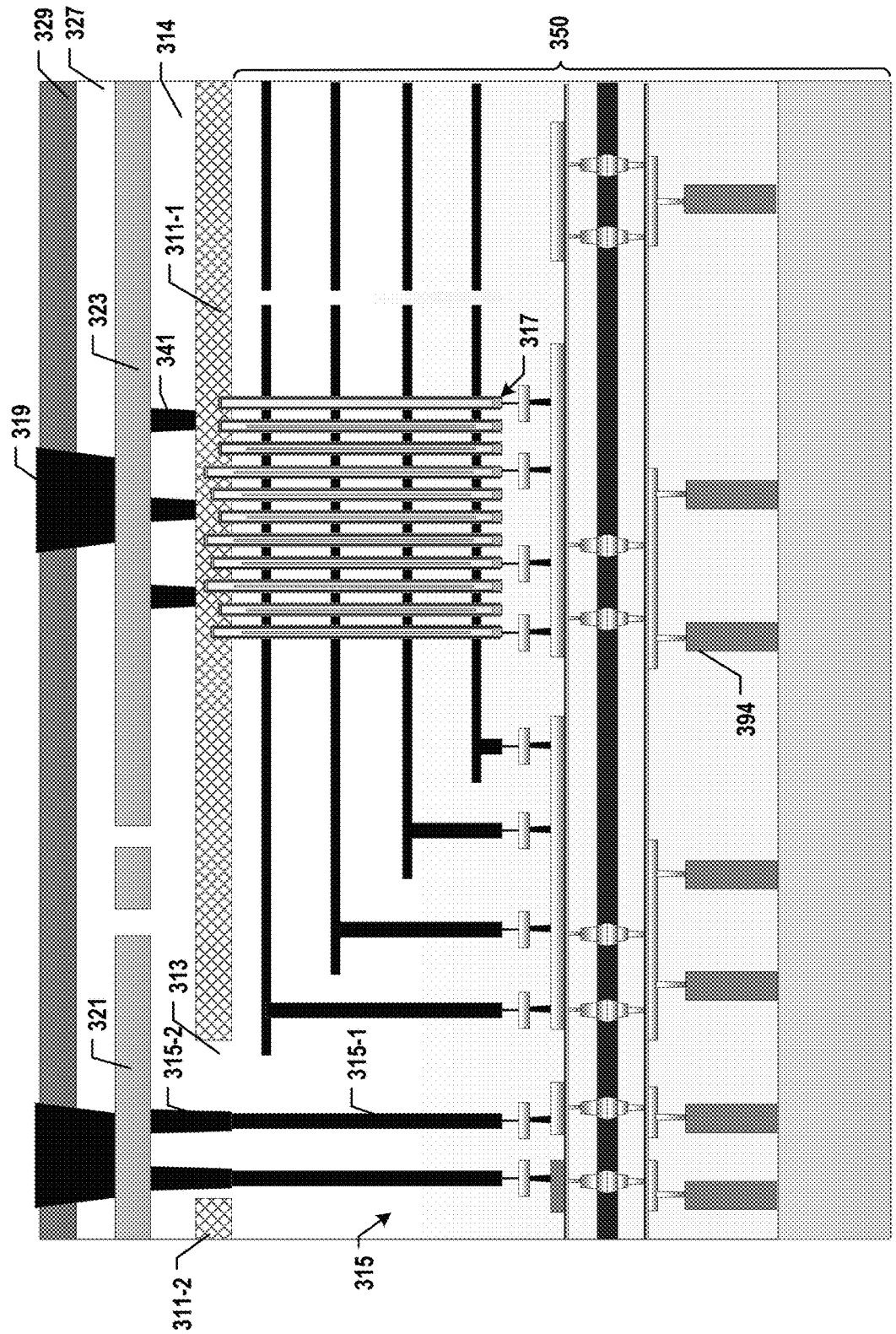
Figure 4A:
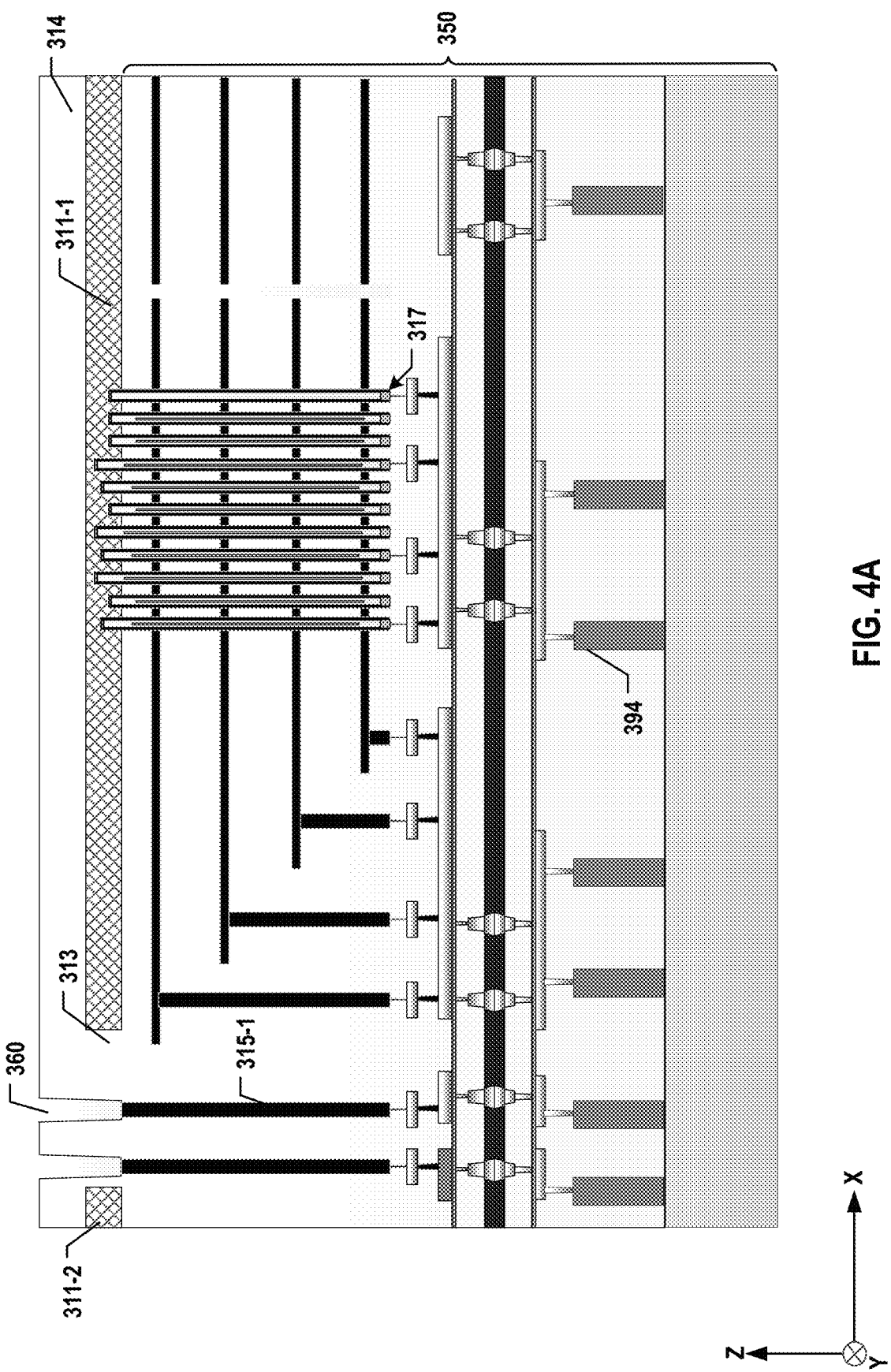
FIGS. 4A and 4B illustrate an example of part of the fabrication process for forming the 3D memory devices in FIG. 2, according to some aspects of the present disclosure.
Figure 4B:
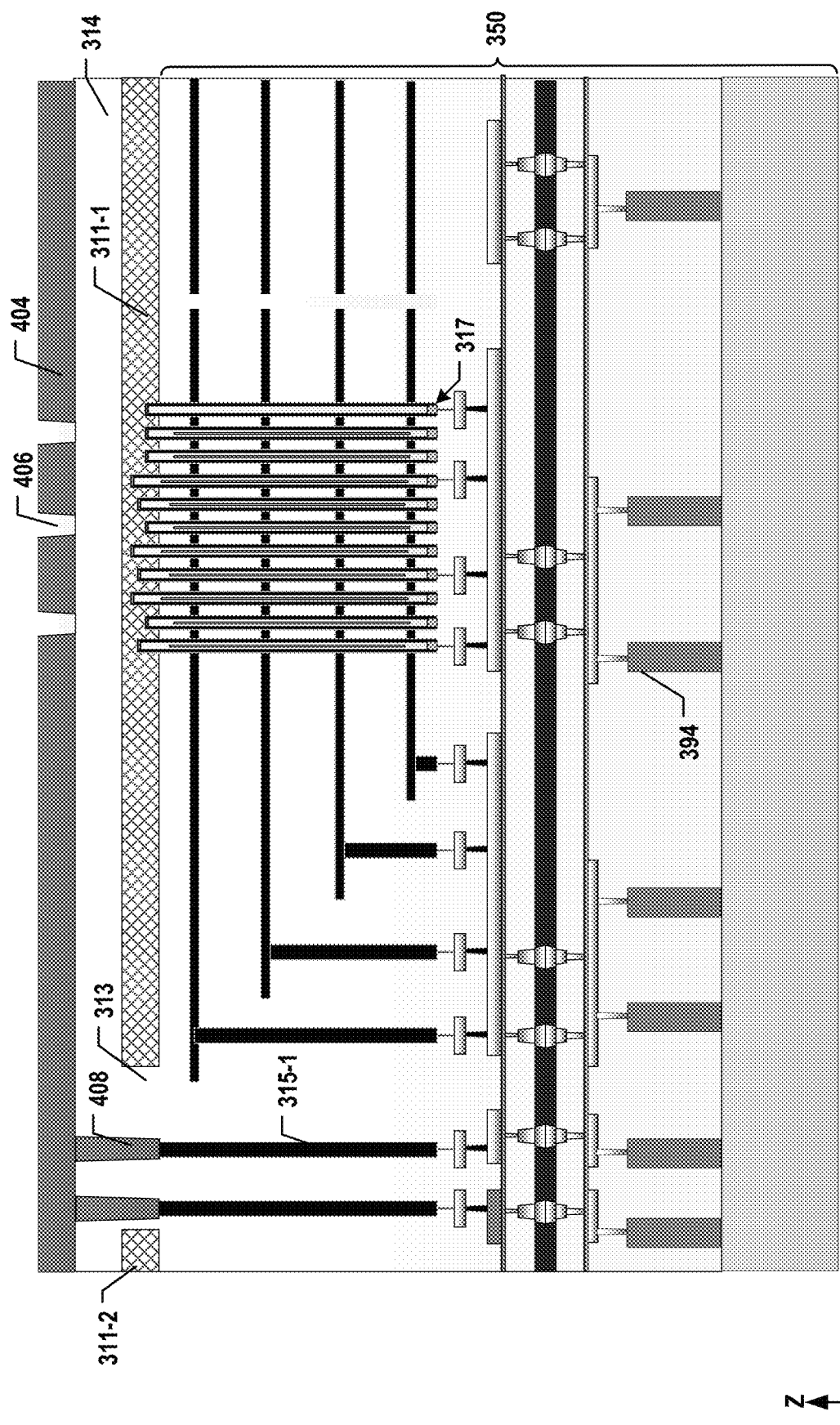
Figure 5:
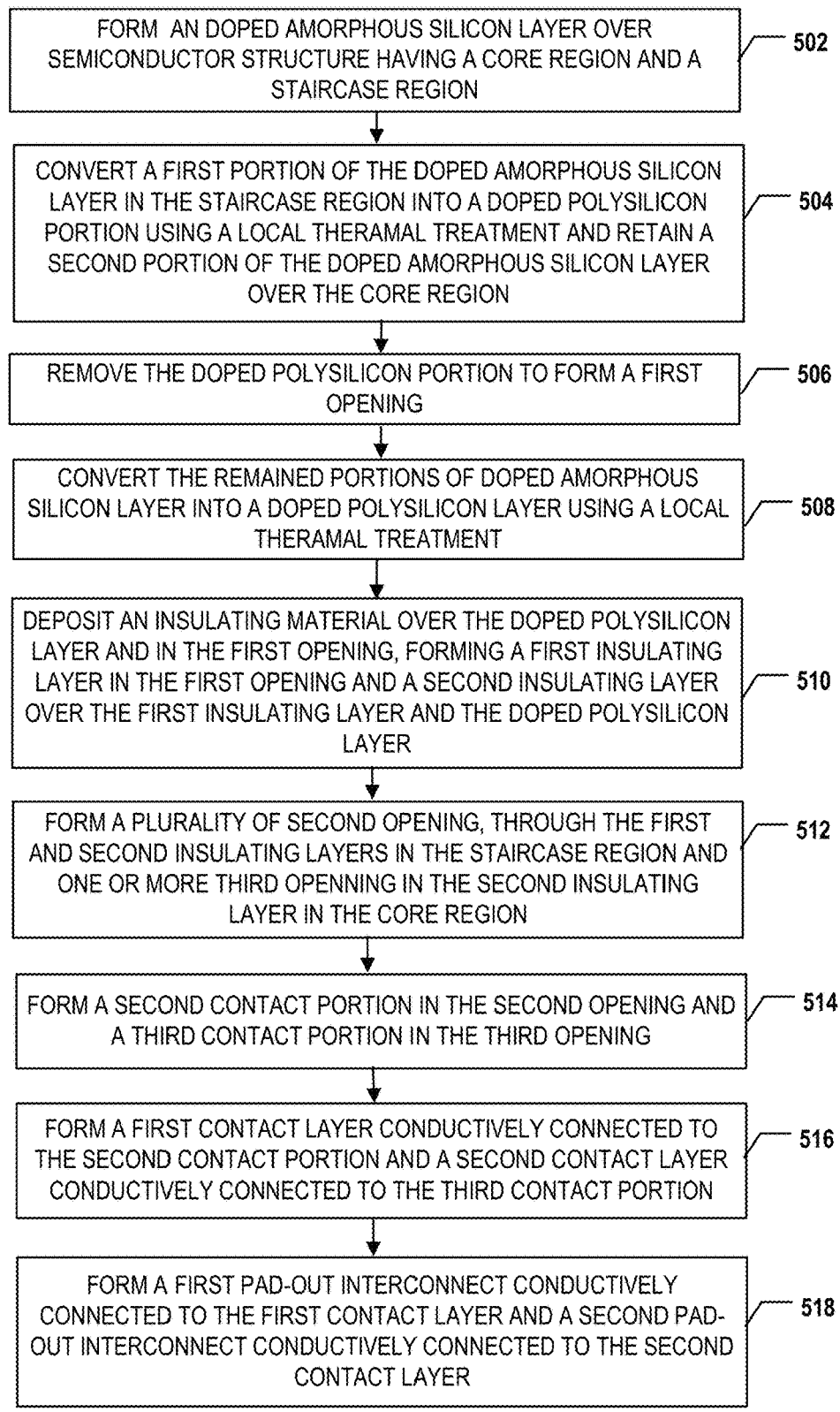
FIG. 5 illustrates a flowchart of a method for forming the 3D memory devices in FIG. 2, according to some aspects of the present disclosure.

FIGS. 3A-3N illustrate a fabrication process for forming 3D memory device 200, according to some aspects of the present disclosure. FIGS. 4A and 4B illustrate part of another fabrication process for forming 3D memory device 200, according to some aspects of the present disclosure. FIG. 5 illustrates a flowchart of a method 500 for forming 3D memory devices 200, according to some aspects of the present disclosure. It is understood that the operations shown in method 500 are not exhaustive and that other operations can be performed as well before, after, or between any of the illustrated operations. Further, some of the operations may be performed simultaneously, or in a different order than shown in FIG. 5.

Referring to FIG. 5, method 500 starts at operation 502, in which a doped amorphous silicon layer is formed over a semiconductor structure having a core region and a staircase region. FIG. 3A illustrates a corresponding structure.

As shown in FIG. 3A, a doped amorphous silicon layer 320 is formed over a semiconductor structure 350, which has a core region 108 and a non-array region 110. Semiconductor structure 350 may be an example of 3D memory device 200. As shown in FIG. 3A, semiconductor structure 350 may include part of a first semiconductor structure bonded with a second semiconductor structure at a bonding interface 309. The second semiconductor structure may include a substrate 302, a device layer 304, an interconnect layer 305, and a bonding layer 306. The part of the first semiconductor structure may include a bonding layer 308, an interconnect layer 310, and an array stack 312. Array stack 312 may include interleaved a plurality of gate conductive layers 339 and a plurality of dielectric layers 340. Array stack 312 may also include an array of NAND memory strings 317 extending in the interleaved gate conductive layers 339 and dielectric layers 340. The first semiconductor structure may also include one or more first contact portions 315-1 extending vertically and coupled to interconnect layer 310. First contact portion 315-1 may subsequently form a lower part of a TSV (e.g., contact structure 215). NAND memory strings 317 may be located in core region 108, and first contact portion s315-1 may be located in non-array region 110. The detailed description of each component may be referred the description of 3D memory device 200 in FIG. 2, and is not repeated herein.

To form the first semiconductor structure, a stack structure, such as a memory stack including interleaved gate conductive layers and dielectric layers, is formed on a first substrate to form array stack 312. In some implementations, the first substrate includes a suitable base material such as silicon. To form the memory stack, in some implementations, a dielectric stack (not shown) including interleaved sacrificial layers (not shown) and the dielectric layers is formed on the first substrate. In some implementations, each sacrificial layer includes a layer of silicon nitride, and each dielectric layer includes a layer of silicon oxide. The interleaved sacrificial layers and dielectric layers can be formed by one or more thin film deposition processes including, but not limited to, chemical vapor deposition (CVD), physical vapor deposition (PVD), atomic layer deposition (ALD), or any combination thereof. The dielectric stack may be repeatedly patterned to form a plurality of stairs in non-array region 110. The memory stack can then be formed by a gate replacement process, e.g., replacing the sacrificial layers with the conductive layers using wet/dry etch of the sacrificial layers selective to the dielectric layers and filling the resulting recesses with the conductive layers. In some implementations, each conductive layer includes a metal layer, such as a layer of W. It is understood that the memory stack may also be formed by alternatingly depositing conductive layers (e.g., doped polysilicon layers) and dielectric layers (e.g., silicon oxide layers) without the gate replacement process in some examples. In some implementations, a pad oxide layer (e.g., thermally grown local oxidation of silicon (LOCOS)), including silicon oxide, is formed between the memory stack and the first substrate. A plurality of contact vias may be formed extending vertically and landed on the stairs to form electrical connections between gate conductive layers 339 and interconnect layer 310 that is to be formed.

NAND memory strings 317 may be formed above the first substrate. Each NAND memory string 317 extends vertically through the dielectric stack (or the memory stack, depending on the fabrication process) to be in contact with the first substrate. In some implementations, the fabrication processes to form NAND memory string 317 include forming a channel hole through the dielectric stack (or the memory stack) and into the first substrate using dry etching/ and or wet etching, such as deep reactive-ion etching (DRIE), followed by subsequently filling the channel hole with a plurality of layers, such as a memory film (e.g., a tunneling layer, a storage layer, and a blocking layer) and a semiconductor layer, using thin film deposition processes such as ALD, CVD, PVD, or any combination thereof.

In some implementations, interconnect layer 310 is formed above the array of NAND memory strings 317 on the first substrate. Interconnect layer 310 can include a first plurality of interconnects in one or more ILD layers. Interconnect layer 310 can include interconnects of MEOL and/or BEOL in a plurality of ILD layers to make electrical connections with NAND memory strings 317. In some implementations, interconnect layer 310 includes multiple ILD layers and interconnects therein formed in multiple processes. For example, the interconnects in interconnect layer 310 can include conductive materials deposited by one or more thin film deposition processes including, but not limited to, CVD, PVD, ALD, electroplating, electroless plating, or any combination thereof. Fabrication processes to form interconnects can also include photolithography, chemical mechanical polishing (CMP), wet/dry etch, or any other suitable processes. The ILD layers can include dielectric materials deposited by one or more thin film deposition processes including, but not limited to, CVD, PVD, ALD, or any combination thereof. The ILD layers and interconnects illustrated can be collectively referred to as interconnect layer 310. In some implementations, the interconnects in interconnect layer 310 include W, which has a relatively high thermal budget among conductive metal materials to sustain later high-temperature processes.

In some implementations, bonding layer 308 is formed above interconnect layer 310. Bonding layer 308 can include a plurality of first bonding contacts 331 surrounded by dielectrics. In some implementations, a dielectric layer is deposited on the top surface of interconnect layer 310 by one or more thin film deposition processes including, but not limited to, CVD, PVD, ALD, or any combination thereof. First bonding contacts 331 can then be formed through the dielectric layer and in contact with the interconnects in interconnect layer 310 by first patterning contact holes through the dielectric layer using patterning process (e.g., photolithography and dry/wet etch of dielectric materials in the dielectric layer). The contact holes can be filled with a conductor (e.g., Cu). In some implementations, filling the contact holes includes depositing an adhesion (glue) layer, a barrier layer, and/or a seed layer before depositing the conductor.

To form the second semiconductor structure, device layer 304 is formed on substrate 302 (e.g., a second substrate). Device layer 304 may include a plurality of transistors 394 on substrate 302. Substrate 302 can be a silicon substrate having single crystalline silicon. The transistors 394 can be formed by a plurality of processes including, but not limited to, photolithography, dry/wet etch, thin film deposition, thermal growth, implantation, CMP, and any other suitable processes. In some implementations, doped regions are formed in substrate 302 by ion implantation and/or thermal diffusion, which function, for example, as wells and source/drain regions of the transistors 394. In some implementations, isolation regions (e.g., shallow trench isolation (STIs)) are also formed in the substrate 302 by wet/dry etch and thin film deposition. The transistors 394 may function as part or all of the peripheral circuits for controlling NAND memory strings 317. It is understood that the details of fabricating transistors 394 may vary depending on the types of the transistors 394 and thus, are not elaborated for ease of description.

In some implementations, interconnect layer 305 is formed above the transistor 394 on the substrate 302. Interconnect layer 305 can include a plurality of interconnects in one or more ILD layers. As illustrated in FIG. 3, interconnect layer 305 can be formed above the transistors 394 in device layer 304. Interconnect layer 305 can include interconnects of MEOL and/or BEOL in a plurality of ILD layers to make electrical connections with the transistors 394. In some implementations, interconnect layer 305 includes multiple ILD layers and interconnects therein formed in multiple processes. In some implementations, first contact portions 315-1 may be formed, in non-array region 110, extending in array stack 312 and coupled to interconnects in interconnect layer 305. The formation of first contact portions 315-1 may include photolithography, etching, and deposition. For example, first contact portions 315-1 and the interconnects in interconnect layer 305 can include conductive materials deposited by one or more thin film deposition processes including, but not limited to, CVD, PVD, ALD, electroplating, electroless plating, or any combination thereof. Fabrication processes to form interconnects can also include photolithography, CMP, wet/dry etch, or any other suitable processes. The ILD layers can include dielectric materials deposited by one or more thin film deposition processes including, but not limited to, CVD, PVD, ALD, or any combination thereof. The ILD layers and interconnects can be collectively referred to as interconnect layer 305. In some implementations, the interconnects in interconnect layer 305 include W, which has a relatively high thermal budget among conductive metal materials to sustain later high-temperature processes.

In some implementations, bonding layer 306 is formed above interconnect layer 305. Bonding layer 306 can include a plurality of second bonding contacts 333 surrounded by dielectrics. In some implementations, a dielectric layer is deposited on the top surface of interconnect layer 305 by one or more thin film deposition processes including, but not limited to, CVD, PVD, ALD, or any combination thereof. Second bonding contacts 333 can then be formed through the dielectric layer and in contact with the interconnects in interconnect layer 305 by first patterning contact holes through the dielectric layer using patterning process (e.g., photolithography and dry/wet etch of dielectric materials in the dielectric layer). The contact holes can be filled with a conductor (e.g., Cu). In some implementations, filling the contact holes includes depositing an adhesion (glue) layer, a barrier layer, and/or a seed layer before depositing the conductor.

As illustrated in FIG. 3A, the first semiconductor structure (e.g., array stack 312 and NAND memory strings 317 formed therethrough) are flipped upside down. Bonding layer 308 facing down is bonded with bonding layer 306 facing up, i.e., in a face-to-face manner, thereby forming bonding interface 309. That is, the first and second bonding contacts in bonding layers 308 and 306 are bonded at bonding interface 309. In some implementations, a treatment process, e.g., plasma treatment, wet treatment and/or local thermal treatment, is applied to bonding surfaces prior to bonding. As a result of the bonding, e.g., hybrid bonding, the first and second bonding contacts 331 and 333 on opposite sides of bonding interface 309 can be inter-mixed. After the bonding, first bonding contacts 331 in bonding layer 308 and second bonding contacts 333 in bonding layer 306 are aligned and in contact with one another, such that array stack 312 and NAND memory strings 317 formed therethrough can be coupled to the transistors 394 through the bonded bonding contacts across bonding interface 309, according to some implementations. The first substrate may then be partially or fully removed to expose source ends of NAND memory strings 317. In some implementations, the removal of the first substrate includes a suitable etching process (e.g., dry etch and/or wet etch) and/or a planarization process (e.g., chemical mechanical polishing or CMP). The bonded chip, with the first substrate partially or fully removed, may be referred to as semiconductor structure 350.

Doped amorphous silicon layer 320 may be deposited over semiconductor structure 350 on the side/surface that the source ends of NAND memory strings 317 are exposed. Doped amorphous silicon layer 320 may be in contact with at least the source ends of a plurality of, e.g., all, NAND memory strings 317 in core region 108. In some implementations, doped amorphous silicon layer 320 covers and be in contact with at least one, e.g., all, first contact portions 315-1 in non-array region 110. For example, doped amorphous silicon layer 320 may cover both core region 108 and non-array region 110. In some implementations, doped amorphous silicon layer 320 is deposited using a low-temperature deposition process, such as low-temperature chemical vapor deposition (CVD). For example, the deposition temperature may range from 400 degrees Celsius to 450 degrees Celsius. The dopants, e.g., phosphorus and/or arsenic, may be doped using an in-situ doping process. In some implementations, the thickness of doped amorphous silicon layer 320 ranges from 100 nm to 600 nm. In various implementations, the thickness of doped amorphous silicon layer 320 is controlled to be in a desirable range such that the subsequent local thermal treatment, e.g., laser anneal process, can fully convert a selected area.

Method 500 proceeds to operation 504, in which a first portion of the doped amorphous silicon layer in the staircase region is converted into a doped polysilicon portion using a local thermal treatment and retain a second portion of the doped amorphous silicon layer over the core region. FIG. 3B illustrates a corresponding structure.

As shown in FIG. 3B, a first portion of doped amorphous silicon layer 320a may be converted to a doped polysilicon portion, and a second portion of doped amorphous silicon layer 320b may be remained. In some implementations, a third portion of doped amorphous silicon layer 320c in non-array region 110 may also be remained. First portion of doped amorphous silicon layer 320a may be over, e.g., covering, any/all first contact portions 315-1 to be insulated from NAND memory strings 317. In some implementations, first portion of doped amorphous silicon layer 320a is located partially or fully in non-array region 110. The conversion of doped amorphous silicon to doped polysilicon may include a local thermal treatment, such as a laser anneal process. The local thermal treatment may be confined in a desired controlled area, and would not affect other thermal-sensitive structures, such as bonding contacts 331 and 332 at bonding interface 209 and other copper structures/interconnects. First portion of doped amorphous silicon layer 320a may crystalize during the local thermal treatment and form a doped polysilicon portion. In some implementations, the temperature of the laser anneal process may range from 1300 degrees Celsius to 1700 degrees Celsius. In some implementations, the laser anneal process includes a plurality of laser pulses, each having a pulse time of 100 ns (i.e., nanoseconds) to 300 ns.

The local thermal treatment, e.g., the laser anneal process, may be controlled to perform only on first portion of doped amorphous silicon layer 320a. A lateral dimension L1 of first portion of doped amorphous silicon layer 320a, e.g., in the x-direction and/or y-direction, may be sufficiently large to cover at least a plurality of, e.g., all, first contact portions 315-1. For example, lateral dimension L1 may be equal to or less than a lateral dimension of non-array region 110 in the x-direction. In some implementations, lateral dimension L1 may be equal to or less than a lateral dimension of the staircase region. In some embodiments, latera dimension L1, e.g., along the x-direction and/ory-direction, may be equal to or greater than three times the thickness of doped amorphous silion layer 320a in the z-direction. In some implementations, the area of first portion of amorphous silicon layer 320a may cover the total area of all first contact portions 315-1 in all lateral directions. Meanwhile, a lateral dimension L2 of second portion of doped amorphous silicon layer 320b may be greater than or equal to the total lateral dimensions of all NAND memory strings 317 in the x-direction. For example, an area of second portion of doped amorphous silicon layer 320b may fully cover all NAND memory strings 317 and thus be equal to or greater than the total area of all NAND memory strings 317. In some implementations, lateral dimension L2 is equal to or greater than a lateral dimension of core region 108.

Referring back to FIG. 5, method 500 proceeds to operation 506, in which the doped polysilicon portion is removed to form a first opening. FIG. 3C illustrates a corresponding structure.

As shown in FIG. 3C, the doped polysilicon layer, converted from first portion of doped amorphous silicon layer 320a, may be selectively removed, forming a first opening 313a in doped amorphous silicon layer 320. First opening 313a may expose first contact portions 315-1, e.g., any first contact portions 315-1 covered by the doped polysilicon layer. In some implementations, an aspect ratio (e.g., a ratio of depth over width) of first opening 313a is less than or equal to 1/3. For example, the aspect ratio is less than or equal to 1/5. The small aspect ration can allow the deposition process of insulating material into first opening 313a to be cheaper and easier. In some implementations, no ALD is needed for the deposition. In some implementations, first opening 313a is a single opening. Second portion of doped amorphous silicon layer 320b may be remained. In some implementation, third doped amorphous silicon layer 320c, if any, may be remained.

The doped polysilicon layer may be removed using an etchant having a higher etch rate on the doped polysilicon than on doped amorphous silicon such that the doped polysilicon layer can be selectively etched away from doped amorphous silicon layer 320. In some implementations, the etchant includes ammonia.

Referring back to FIG. 5, method 500 proceeds to operation 508, in which the remained portions of doped amorphous silicon layer are converted to a doped polysilicon layer using a local theramal treatment. FIG. 3D illustrates a corresponding structure.

As shown in FIG. 3D, the remained second portion of doped amorphous silicon layer 320b and any remained third portion of doped amorphous silicon layer 320c may be converted to a doped polysilicon layer 311 using a local thermal treatment, such as a laser anneal process, similar to or the same as the laser anneal process in operation 504. The doped polysilicon layer 311 may be referred to as a semiconductor layer. The remained portions of doped amorphous silicon layer 320 may crystalize during the local thermal treatment and form a doped polysilicon layer. The crystallization of doped amorphous silicon may be controlled to be in any suitable area in doped amorphous silicon layer 320, where an electrical connection needs to be formed. In some implementations, first portion of doped amorphous silicon layer 320b may be converted to a first portion of doped polysilicon layer 311-1, and any third portion of doped amorphous silicon layer 320c may be converted to a second portion of doped polysilicon layer 311-2. In some implementations, the temperature of the laser anneal process may range from 1300 degrees Celsius to 1700 degrees Celsius. In some implementations, the laser anneal process includes a plurality of laser pulses, each having a pulse time of 100 ns (i.e., nanoseconds) to 300 ns. The local thermal treatment, e.g., the laser anneal process, may be controlled to perform on at least second portion of doped amorphous silicon layer 320b. In some implementations, the local thermal treatment is performed only on remained second portion of amorphous silicon layer 320b but not on third portion of amorphous silicon layer 320c. In some implementations, the local thermal treatment is performed only on the part of remained second portion of amorphous silicon layer 320b in contact with NAND memory strings 317, but not on the rest of second portion of amorphous silicon layer 320b or third portion of amorphous silicon layer 320c.

Referring back to FIG. 5, method 500 proceeds to operation 510, in which an insulating material is deposited over the polysilicon layer and in the first opening, forming a first insulating layer in the first opening and a second insulating layer over the first insulating layer and the doped polysilicon layer. FIG. 3E illustrates a corresponding structure.

As shown in FIG. 3E, an insulating material may be deposited over doped polysilicon layer 311 and in first opening 313a, forming a first insulating layer 313 in first opening 313a and a second insulating layer 314 over first insulating layer 313 and doped polysilicon layer 311. First insulating layer 313 may be formed by filling first opening 313a with the insulating material and may cover any first contact portions 315-1 exposed in first opening 313a. First insulating layer 313a may be in contact with first portion of doped polysilicon layer 311-1 and second portion of doped polysilicon layer 311-2 (if any). In some implementations, if doped polysilicon layer 311 does not include second portion of doped polysilicon layer 311-2, first insulating layer 313 may laterally extend to an outer periphery of non-array region 110. The insulating material, such as a dielectric material, may include silicon oxide, silicon nitride, silicon oxynitride, and/or other low-k dielectrics. The insulating material may be deposited using any suitable deposition method such as CVD, PVD, and/or ALD. In some implementations, the deposition of the insulating material does not include ALD.

Referring back to FIG. 5, method 500 proceeds to operation 512, in which a plurality of second opening is formed through the first and second insulating layers in the staircase region and one or more third opening is formed in the second insulating layer in the core region. FIGS. 3F and 3G illustrate corresponding structures.

As shown in FIG. 3F, a patterned photoresist layer 352 may be formed over second insulating layer 314 in core region 108 and non-array region 110. Patterned photoresist layer 352 may include one or more openings 354 (in core region 108) for forming contact portions connecting first portion of doped polysilicon layer 311-1 and pad-out interconnects, and one or more openings 356 for forming contact portions connecting first contact portions 315-1. Openings 354 and 356 may each be in contact with second insulating layer 314. In some implementations, openings 356 may each be aligned with a respective first contact portions 315-1 in the z-direction. Patterned photoresist layer 352 may be formed by coating a photoresist layer over second insulating layer 314 and performing a photolithography process, forming openings 354 and 356.

As shown in FIG. 3G, a suitable etching process, e.g., dry etch and/or wet etch, may be performed, using patterned photoresist layer 352 as the etch mask, to form a plurality of second openings 360 through first and second insulating layers 313 and 314 and each in contact with a respective first contact portion 315-1. In the same etching process, one or more third openings 358 are formed in second insulating layer 314 and in contact with first portion of doped polysilicon layer 311-1. Patterned photoresist layer 352 may then be removed, e.g., using an ashing process.

In some other implementations, the second openings and the third openings can be formed separately, e.g., using different etching processes. FIGS. 4A and 4B illustrate an alternative fabrication process to form the second openings and the third openings in separate etching processes. As shown in FIG. 4A, second opening 360 may first be formed by patterning first and second insulating layers 313 and 314 using a first patterned photoresist layer (not shown) that includes openings for forming second openings 360 but not for any third openings. First and second insulating layers 313 and 314 may then be etched by a first etching process, in non-array region 110, to form second openings 360 each aligned with a respective first contact portion 315-1. The first patterned photoresist layer may be removed. Another layer of photoresist layer may then be spined onto second insulating layer 314 and fill second opening 360, forming a photoresist portion 408 in each second opening 360. The photoresist layer may be patterned to form a second patterned photoresist layer 404 that includes an opening 406 for forming a third opening in second insulating layer 314. A second etching process may be performed, using second patterned photoresist layer 404 as the etch mask, to form third opening 358 in second insulating layer 314. Second patterned photoresist layer 404 and photoresist portions 408 may then be removed. In some implementations, the first etching process and the second etching process may each include a suitable dry etch and/or wet etch. In some implementations, the removal of photoresist may include an ashing process.

Referring back to FIG. 5, method 500 proceeds to operation 514, in which a second contact portion is formed in each second opening and a third contact portion is formed in each third opening. FIG. 3H illustrates a corresponding structure.

As shown in FIG. 3H, a second contact portion 315-2 is formed in each second opening 360 and a third contact portion 341 is formed in each third opening 358. Second contact portion 315-2 may each be in contact with the respective first contact portion 315-1. In some implementations, each first contact portion 315-1 and the respective second contact portion 315-2 may form a contact structure 315, e.g., a TSC. Second and third contact portions 315-2 and 341 may each include tungsten (W), cobalt (Co), copper (Cu), aluminum (Al), polysilicon, doped silicon, silicides, or any combination thereof. In some implementations, second and third contact portions 315-2 and 341 may be formed by depositing a layer of conductive material to fill second and third openings 360 and 358, and perform a recess etch (e.g., a blank etch) to remove any excess conductive material on second insulating layer 314. In some implementations, the deposition of the conductive material includes CVD, PVD, ALD, electroplating, electroless plating, or a combination thereof. The recess etch may include a suitable dry etch and/or wet etch.

Referring back to FIG. 5, method 500 proceeds to operation 516, in which a first contact layer is formed conductively connected to the second contact portion and a second contact layer is formed to be conductively connected to the third contact portion. FIGS. 3I-3K illustrate corresponding structures.

As shown in FIG. 3I, a contact material layer 362 may be formed in contact with second contact portions 315-2 and third contact portions 341. Contact material layer 362 may include tungsten (W), cobalt (Co), copper (Cu), aluminum (Al), polysilicon, doped silicon, silicides, or any combination thereof. In some implementations, contact material layer 362 may be deposited using CVD, PVD, ALD, electroplating, electroless plating, or a combination thereof.

As shown in FIG. 3J, a patterned photoresist layer 364 may be formed over contact material layer 362. Patterned photoresist layer 364 may include one or more openings 366 for patterning contact material layer 362 to disconnect a portion of contact material layer 362 conductively connected to third contact portions 341 (e.g., NAND memory strings 317) from another portion of contact material layer 362 conductively connected to contact structures 315. In some implementations, in the x-y plane, openings 366 may be located between third contact portions 341 and contact structures 315 and may be in contact with contact material layer 362. Patterned photoresist layer 364 may be formed by spinning on a photoresist layer over contact material layer 362 and patterning the photoresist layer using a photolithography process.

As shown in FIG. 3K, a first contact layer 321 is formed conductively connected to second contact portions 315-2 (or contact structures 315), and a second contact layer 323 is formed conductively connected to third contact portions 341. First contact layer 321 may be disconnected from second contact layer 323 by one or more openings 325 between first and second contact layers 321 and 323. Openings 325 may be formed by etching contact material layer 362 using patterned photoresist layer 364 as the etch mask. In some implementations, the etching of contact material layer 362 includes a suitable dry etch and/or wet etch. Patterned photoresist layer 364 may then be removed using an ashing process.

Referring back to FIG. 5, method 500 proceeds to operation 518, in which a first pad-out interconnect is conductively connected to the first contact layer and a second pad-out interconnect is conductively connected to the second contact layer. FIGS. 3L-3N illustrate corresponding structures.

As shown in FIG. 3L, dielectric materials may be deposited over first and second contact layers 321 and 323 to form one or more dielectric layers. The dielectric material may fill openings 325 to provide insulation between first and second contact layers 321 and 323. In some implementations, a first dielectric material is deposited in contact with first and second contact layers 321 and filling openings 325, forming a first dielectric layer 327. A second dielectric material may be deposited over first dielectric layer 327, forming a second dielectric layer 329. In some implementations, first dielectric layer 327 includes silicon oxide, and second dielectric layer 329 includes silicon nitride. The deposition of first and second dielectric materials may each include CVD, PVD, ALD, or a combination thereof.

As shown in FIG. 3M, a patterned photoresist layer 368 may be formed over second dielectric layer 329. Patterned photoresist layer 368 may include one or more openings 370 for patterning first and second dielectric layers 327 and 329 and forming pad-out interconnects. In some implementations, openings 370 may be located above contact structures 315 and third contact portions 341, respectively. Patterned photoresist layer 368 may be formed by spinning on a photoresist layer over second dielectric layer 329 and patterning the photoresist layer using a photolithography process. First and second dielectric layers 327 and 329 may be etched, using patterned photoresist layer 368 as the etch mask, to form respective openings (not shown) in first and second dielectric layers 327 and 329. At least one opening may be in contact with first contact layer 321, and at least one opening may be in contact with second contact layer 323. Patterned photoresist layer 368 may be removed using an ashing process.

As shown in FIG. 3N, a plurality of pad-out interconnects 319 are formed in the openings. At least one pad-out interconnect 319 may be in contact with first contact layer 321, and at least one pad-out interconnect may be in contact with second contact layer 323. Pad-out interconnects 319 may include tungsten (W), cobalt (Co), copper (Cu), aluminum (Al), polysilicon, doped silicon, silicides, or any combination thereof. In some implementations, pad-out interconnects 319 may be deposited using CVD, PVD, ALD, electroplating, electroless plating, or a combination thereof. In some implementations, a recess etch, e.g., dry etch and/or wet etch, is performed after the deposition to remove any excess conductive material on second dielectric layer 329.

Figure 6:
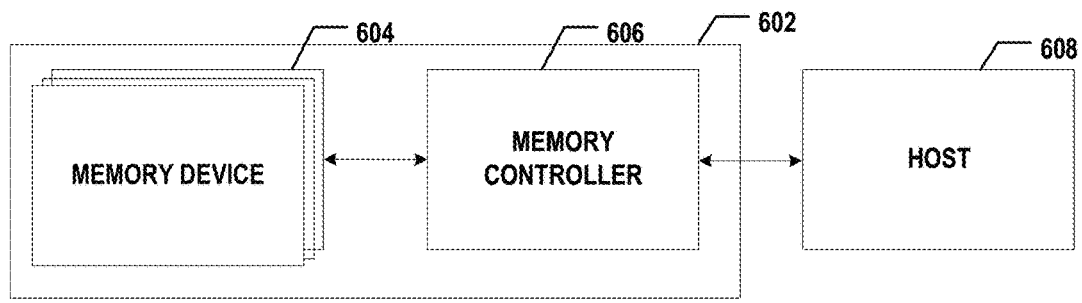
FIG. 6 illustrates a block diagram of an exemplary system having a memory device, according to some aspects of the present disclosure.

FIG. 6 illustrates a block diagram of a system 600 having a memory device, according to some aspects of the present disclosure. System 600 can be a mobile phone, a desktop computer, a laptop computer, a tablet, a vehicle computer, a gaming console, a printer, a positioning device, a wearable electronic device, a smart sensor, a virtual reality (VR) device, an argument reality (AR) device, or any other suitable electronic devices having storage therein. As shown in FIG. 6, system 600 can include a host 608 and a memory system 602 having one or more memory devices 604 and a memory controller 606. Host 608 can be a processor of an electronic device, such as a central processing unit (CPU), or a system-on-chip (SoC), such as an application processor (AP). Host 608 can be configured to send or receive the data to or from memory devices 604.

Memory device 604 can be any memory devices disclosed herein, such as 3D memory device 200. In some implementations, each memory device 604 includes an array of memory cells, a peripheral circuit of the array of memory cells. The array of memory cells and the peripheral circuit are stacked over one another in different planes, as described above in detail.

Memory controller 606 is coupled to memory device 604 and host 608 and is configured to control memory device 604, according to some implementations. Memory controller 606 can manage the data stored in memory device 604 and communicate with host 608. In some implementations, memory controller 606 is designed for operating in a low duty-cycle environment like secure digital (SD) cards, compact Flash (CF) cards, universal serial bus (USB) Flash drives, or other media for use in electronic devices, such as personal computers, digital cameras, mobile phones, etc. In some implementations, memory controller 606 is designed for operating in a high duty-cycle environment SSDs or embedded multi-media-cards (eMMCs) used as data storage for mobile devices, such as smartphones, tablets, laptop computers, etc., and enterprise storage arrays. Memory controller 606 can be configured to control operations of memory device 604, such as read, erase, and program operations. In some implementations, memory controller 606 is configured to control the array of memory cells through the first peripheral circuit and the second peripheral circuit. Memory controller 606 can also be configured to manage various functions with respect to the data stored or to be stored in memory device 604 including, but not limited to bad-block management, garbage collection, logical-to-physical address conversion, wear leveling, etc. In some implementations, memory controller 606 is further configured to process error correction codes (ECCs) with respect to the data read from or written to memory device 604. Any other suitable functions may be performed by memory controller 606 as well, for example, formatting memory device 604. Memory controller 606 can communicate with an external device (e.g., host 608) according to a particular communication protocol. For example, memory controller 606 may communicate with the external device through at least one of various interface protocols, such as a USB protocol, an MIVIC protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a Firewire protocol, etc.

Figures 7A, 7B:
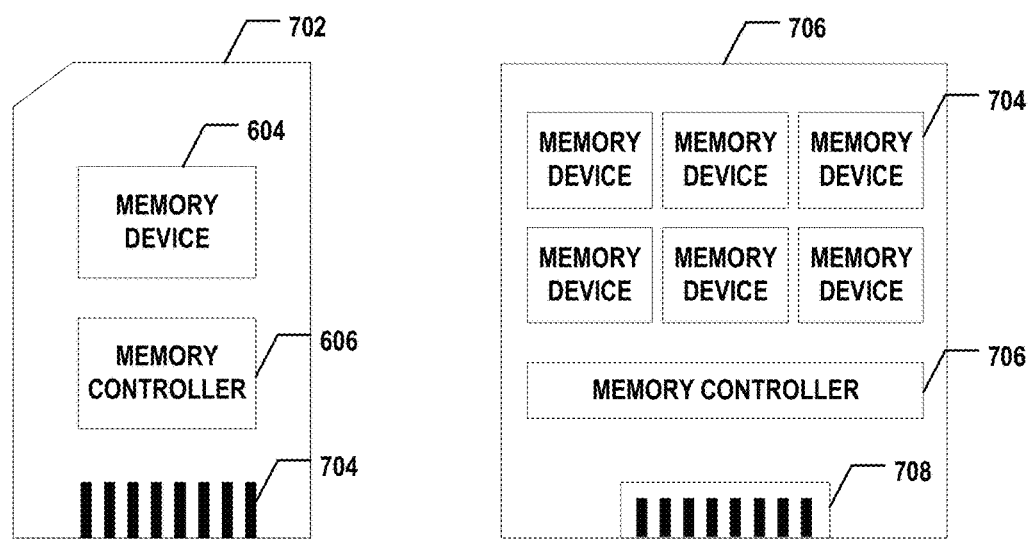
FIG. 7A illustrates a diagram of an exemplary memory card having a memory device, according to some aspects of the present disclosure.
FIG. 7B illustrates a diagram of an exemplary solid-state drive (SSD) having a memory device, according to some aspects of the present disclosure.

Memory controller 606 and one or more memory devices 604 can be integrated into various types of storage devices, for example, be included in the same package, such as a universal Flash storage (UFS) package or an eMMC package. That is, memory system 602 can be implemented and packaged into different types of end electronic products. In one example as shown in FIG. 7A, memory controller 606 and a single memory device 604 may be integrated into a memory card 702. Memory card 702 can include a PC card (PCMCIA, personal computer memory card international association), a CF card, a smart media (SM) card, a memory stick, a multimedia card (MMC, RS-MMC, MMCmicro), an SD card (SD, miniSD, microSD, SDHC), a UFS, etc. Memory card 702 can further include a memory card connector 704 coupling memory card 702 with a host (e.g., host 608 in FIG. 6). In another example as shown in FIG. 7B, memory controller 606 and multiple memory devices 604 may be integrated into an SSD 706. SSD 706 can further include an SSD connector 708 coupling SSD 706 with a host (e.g., host 608 in FIG. 6). In some implementations, the storage capacity and/or the operation speed of SSD 706 is greater than those of memory card 702.

According to one aspect of the present disclosure, a 3D memory device includes a first semiconductor structure and a second semiconductor bonded with the first semiconductor structure. The first semiconductor structure includes an array of NAND memory strings, a semiconductor layer in contact with source ends of the array of NAND memory strings, an insulating layer in contact with the semiconductor layer, and a contact structure in the insulating layer. The insulating layer electrically insulates the contact structure from the semiconductor layer. The second semiconductor structure includes a transistor.

In some implementations, the first semiconductor structure further includes a second contact structure through the insulating layer. The insulating layer is in contact with the semiconductor layer laterally and insulates the contact structure and the second contact structure from each other. The insulating layer insulates the contact structure and the second contact structure from the semiconductor layer.

In some implementations, the semiconductor layer includes a first portion in a core region of the first semiconductor structure and a second portion in a non-array region of the first semiconductor structure. In some implementations, the insulating layer is located in the non-array region of the first semiconductor structure and insulates the first portion and the second portion of the semiconductor layer from each other.

In some implementations, the semiconductor layer is located in a core region of the first semiconductor structure; and the insulating layer is located in the staircase region of the first semiconductor structure.

In some implementations, the semiconductor layer is located in a core region of the first semiconductor structure; and the insulating layer is located in the non-array region and outside a staircase region of the first semiconductor structure.

In some implementations, the insulating layer includes a dielectric material.

In some implementations, the insulating layer includes at least one of silicon oxide, silicon nitride, or silicon oxynitride.

In some implementations, an area of the insulating layer is greater than an area in which a plurality of contact structures is formed and is less than or equal to the non-array region.

In some implementations, the semiconductor layer and the insulating layer has a same thickness that is in a range of 100 nm to 600 nm.

In some implementations, the semiconductor layer includes doped polysilicon.

In some implementations, an area of the semiconductor layer is greater than or equal to an area in which all the NAND memory strings are formed.

In some implementations, the first semiconductor structure further includes a pad-out interconnect layer; and the second semiconductor structure further includes a substrate.

Another aspect of the present disclosure provides a 3D memory device that includes a first semiconductor structure having a core region and a non-array region. The first semiconductor structure includes an array of NAND memory strings in a sub-region of the core region, a semiconductor layer in contact with source ends of the array of NAND memory strings, an insulating layer in the non-array region, and a plurality of contact structures in the insulating layer and in another sub-region of the non-array region. The insulating layer electrically insulates the contact structures from the semiconductor layer. The 3D memory device also includes a second semiconductor structure bonded with the first semiconductor layer. The second semiconductor structure includes a transistor.

In some implementations, an area of the insulating layer is equal to or greater than an area of the other sub-region and is less than or equal to an area of the non-array region; and the insulating layer insulates the contact structures from one another.

In some implementations, an area of the semiconductor layer is equal to or greater than an area of the sub-region.

In some implementations, the insulating layer includes a dielectric material.

In some implementations, the insulating layer includes at least one of silicon oxide, silicon nitride, or silicon oxynitride.

In some implementations, the semiconductor layer and the insulating layer has a same thickness that is in a range of 100 nm to 600 nm.

In some implementations, the semiconductor layer includes doped polysilicon.

In some implementations, the first semiconductor structure further includes a pad-out interconnect layer; and the second semiconductor structure further includes a substrate.

Another aspect of the present disclosure provides a method for forming a 3D memory device. The method includes bonding a first semiconductor structure and a second semiconductor structure together, the first semiconductor structure having a core region and a non-array region. The method also includes depositing a doped amorphous silicon layer over the core region and the non-array region of the first semiconductor structure, removing a first portion of the doped amorphous silicon layer in the non-array region to form an opening that exposes a first contact portion, converting a second portion of the doped amorphous silicon layer in the core region to a doped polysilicon layer, forming an insulating layer in the opening, and forming a second contact portion in the insulating layer. The second contact portion is in contact with the first contact portion.

In some implementations, the method further includes converting the first portion of the doped amorphous silicon layer into a doped polysilicon portion before conversion of the second portion of the doped amorphous silicon layer. Removing the first portion of the doped amorphous silicon layer includes removing, selectively, the doped polysilicon portion from the doped amorphous silicon layer.

In some implementations, converting the first portion of the doped amorphous silicon layer includes performing a local thermal treatment on the first portion of the doped amorphous silicon layer.

In some implementations, converting the second portion of the doped amorphous silicon layer includes performing another local treatment on the second portion of the doped amorphous silicon layer.

In some implementations, the local thermal treatment and the other local thermal treatment each includes a respective laser anneal process.

In some implementations, the respective laser anneal process has an anneal temperature in a range of 1300 degrees Celsius to 1700 degree Celsius, and includes a plurality of laser pulses each having a pulse time of 100 ns to 300 ns.

In some implementations, an etchant for selectively etching the doped polysilicon portion includes ammonia.

In some implementations, depositing the doped amorphous silicon layer includes a low temperature deposition process and an in-situ doping process.

In some implementations, the doped amorphous silicon layer is doped with N-type dopants that include at least one of phosphorous or arsenic.

In some implementations, the insulating layer is formed by a chemical vapor deposition (CVD), a physical vapor deposition (PVD), an atomic layer deposition (ALD), or a combination thereof.

In some implementations, forming the first semiconductor structure includes forming an array of NAND strings and the first contact portion above a substrate; and thinning the substrate to expose source ends of the NAND strings.

In some implementations, the doped amorphous silicon layer is deposited to be in contact with the source ends of the NAND strings.

In some implementations, the method further includes depositing an insulating material to fill the opening and over the doped polysilicon layer to form the insulating layer in the opening and a second insulating layer over the insulating layer. The second insulating layer is in the core region and the non-array region.

In some implementations, the method further includes a second opening in the insulating layer and the second insulating layer to expose the first contact portion, a third opening in the second insulating layer to expose the doped polysilicon layer, and the second contact portion in the second opening and a third contact portion in the third opening. The third contact portion is in contact with the doped polysilicon layer.

In some implementations, the second opening and the third opening are formed in a same patterning process.

In some implementations, the method further includes forming, over the second insulating layer, a first contact layer conductively connected to the second contact portion and a second contact layer conductively connected to the third contact portion. The first contact layer and the second contact layer are insulated from each other. The method may further include forming a pad-out interconnect layer over the first and second contact layers. The pad-out interconnect layer includes respective contact structures conductively connected to the first and second contact layers.

In some implementations, forming the second semiconductor structure includes forming a peripheral circuit over a respective substrate. The peripheral circuit includes a plurality of transistors.

In some implementations, an aspect ratio of the opening is less than or equal to ⅓.

Another aspect of the present disclosure provides a system. The system includes a memory device configured to store data. The memory device includes a first semiconductor structure that has an array of NAND memory strings, a semiconductor layer in contact with source ends of the array of NAND memory strings, an insulating layer in contact with the semiconductor layer, a contact structure in the insulating layer, wherein the insulating layer electrically insulates the contact structure from the semiconductor layer, and a second semiconductor structure bonded with the first semiconductor structure. The second semiconductor structure includes a peripheral circuit. The system also includes a memory controller coupled to the memory device and configured to control the array of NAND memory strings through the peripheral circuit.

The foregoing description of the specific implementations can be readily modified and/or adapted for various applications. Therefore, such adaptations and modifications are intended to be within the meaning and range of equivalents of the disclosed implementations, based on the teaching and guidance presented herein.

The breadth and scope of the present disclosure should not be limited by any of the above-described exemplary implementations, but should be defined only in accordance with the following claims and their equivalents.

What is claimed is:

1. A three-dimensional (3D) memory device, comprising:
a first semiconductor structure comprising:
an array of NAND memory strings,
a semiconductor layer having a bottom surface in contact with source ends of the array of NAND memory strings,
an insulating layer in direct contact with the semiconductor layer laterally and separating the semiconductor layer into a first portion and a second portion, wherein a top surface of the insulating layer is coplanar with a top surface of the semiconductor layer; and a bottom surface of the insulating layer is coplanar with the bottom surface of the semiconductor layer, and first contact structures through the insulating layer and second contact structures in contact with the top surface of the semiconductor layer, wherein the insulating layer electrically insulates the first contact structures from the semiconductor layer and from each other, and a first lateral dimension of each first contact structure aligned with the top surface of the insulating layer is greater than a second lateral dimension of the first contact structure aligned with the bottom surface of the insulating layer and a third lateral dimension of each second contact structure aligned with a bottom surface of a contact layer is greater than a fourth lateral dimension of the second contact structure aligned with the top surface of the semiconductor layer; and
a second semiconductor structure, bonded with the first semiconductor structure, comprising a transistor.

2. The 3D memory device of claim 1, wherein:
the semiconductor layer comprises a first portion in a core region of the first semiconductor structure and a second portion in a non-array region of the first semiconductor structure; and
the insulating layer is located in the non-array region of the first semiconductor structure and insulates the first portion and the second portion of the semiconductor layer from each other.

3. The 3D memory device of claim 2, wherein:
the semiconductor layer is located in the core region of the first semiconductor structure; and
the insulating layer is located in a staircase region of the first semiconductor structure.

4. The 3D memory device of claim 2, wherein:
the semiconductor layer is located in the core region of the first semiconductor structure; and
the insulating layer is located in the non-array region and outside a staircase region of the first semiconductor structure.

5. The 3D memory device of claim 2, wherein an area of the insulating layer is greater than an area in which the first contact structures are formed and is less than or equal to the non-array region.

6. The 3D memory device of claim 1, wherein the semiconductor layer and the insulating layer have a same thickness that is in a range of 100 nm to 600 nm.

7. The 3D memory device of claim 1, wherein the semiconductor layer comprises doped polysilicon.

8. A three-dimensional (3D) memory device, comprising:
a memory cell array structure comprising:
an array of channel structures,
a semiconductor layer having a bottom surface in contact with ends of the array of channel structures,
an insulating layer in direct contact with the semiconductor layer laterally and separating the semiconductor layer into a first portion and a second portion, wherein atop surface of the insulating layer is coplanar with a top surface of the semiconductor layer, and a bottom surface of the insulating layer is coplanar with the bottom surface of the semiconductor layer, and first contact structures through the insulating layer and second contact structures in contact with the top surface of the semiconductor layer, wherein the insulating layer electrically insulates the first contact structures from the semiconductor layer and from each other, and a first lateral dimension of each first contact structure aligned with the top surface of the insulating layer is greater than a second lateral dimension of the first contact structure aligned with the bottom surface of the insulating layer and a third lateral dimension of each second contact structure aligned with a bottom surface of a contact layer is greater than a fourth lateral dimension of the second contact structure aligned with the top surface of the semiconductor layer; and
a peripheral circuit structure stacked with the memory cell array structure in a vertical direction, comprising transistors coupled with the contact structures.

9. The 3D memory device of claim 8, wherein:
the semiconductor layer comprises a first portion in a core region of the memory cell array structure and a second portion in a non-array region of the memory cell array structure; and
the insulating layer is located in the non-array region of the memory cell array structure and insulates the first portion and the second portion of the semiconductor layer from each other.

10. The 3D memory device of claim 9, wherein:
the semiconductor layer is located in an array region of the memory cell array structure; and
the insulating layer is located in a staircase region of the memory cell array structure.

11. The 3D memory device of claim 9, wherein:
the semiconductor layer is located in an array region of the memory cell array structure; and
the insulating layer is located in the non-array region and outside a staircase region of the memory cell array structure.

12. The 3D memory device of claim 9, wherein an area of the insulating layer is greater than an area in which the first contact structures are formed and is less than or equal to the non-array region.

13. The 3D memory device of claim 8, wherein the semiconductor layer and the insulating layer have a same thickness that is in a range of 100 nm to 600 nm.

14. The 3D memory device of claim 8, wherein the semiconductor layer comprises doped polysilicon.

15. The 3D memory device of claim 1, wherein the first semiconductor structure further comprises:
a second insulating layer in contact with the top surface of the semiconductor layer and the top surface of the insulating layer;
the second contact structures embedded in the second insulating layer; and
the contact layer on the second insulating layer, comprising a first contact portion in contact with the contact structures and a second contact portion in contact with the second contact structures, wherein the first contact portion and the second contact portion are separated by an insulating portion.

16. The 3D memory device of claim 15, wherein the first semiconductor structure further comprises:
   a third insulating layer on the contact layer;
   a first pad-out interconnect embedded in the third insulating layer and in contact with the first contact portion; and
   a second pad-out interconnect embedded in the third insulating layer and in contact with the second contact portion.

17. The 3D memory device of claim 8, wherein the memory cell array structure further comprises:
   a second insulating layer in contact with the top surface of the semiconductor layer and the top surface of the insulating layer;
   the second contact structures embedded in the second insulating layer; and
   the contact layer on the second insulating layer, comprising a first contact portion in contact with the contact structures and a second contact portion in contact with the second contact structures, wherein the first contact portion and the second contact portion are separated by an insulating portion.

18. The 3D memory device of claim 17, wherein the memory cell array structure further comprises:
   a third insulating layer on the contact layer;
   a first pad-out interconnect embedded in the third insulating layer and in contact with the first contact portion; and
   a second pad-out interconnect embedded in the third insulating layer and in contact with the second contact portion.

* * * * *